United States Patent
Okumura et al.

(10) Patent No.: US 7,513,214 B2
(45) Date of Patent: Apr. 7, 2009

(54) PLASMA PROCESSING METHOD AND APPARATUS

(75) Inventors: Tomohiro Okumura, Kadoma (JP); Hideo Haraguchi, Toyonaka (JP); Takuya Matsui, Matsubara (JP); Izuru Matsuda, Kadoma (JP); Akio Mitsuhashi, Yao (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 480 days.

(21) Appl. No.: 10/920,180

(22) Filed: Aug. 18, 2004

(65) Prior Publication Data

US 2005/0011453 A1    Jan. 20, 2005

Related U.S. Application Data

(62) Division of application No. 09/511,398, filed on Feb. 23, 2000, now Pat. No. 6,808,759.

(30) Foreign Application Priority Data

Feb. 23, 1999  (JP)  .................. 11-044359
Feb. 24, 1999  (JP)  .................. 11-046245

(51) Int. Cl.
*C23C 16/00*  (2006.01)
*H05H 1/46*  (2006.01)

(52) U.S. Cl. ..................... 118/723 E; 427/569

(58) Field of Classification Search ............ 156/345.43, 156/345.44, 345.45, 345.46, 345.47; 118/723 E, 118/723 R
See application file for complete search history.

(56) References Cited

U.S. PATENT DOCUMENTS

| | | | |
|---|---|---|---|
| 5,300,460 A * | 4/1994 | Collins et al. ............... 438/712 |
| 5,622,635 A | 4/1997 | Cuomo ........................ 427/569 |
| 5,690,781 A | 11/1997 | Yoshida et al. ............... 118/723 |
| 5,718,795 A | 2/1998 | Plavidal ........................ 216/71 |
| 5,783,492 A | 7/1998 | Higuchi et al. ............... 427/569 |
| 5,820,947 A * | 10/1998 | Itoh ............................. 427/577 |
| 5,824,605 A | 10/1998 | Chen et al. ................... 118/723 |
| 5,904,780 A | 5/1999 | Tomoyasu ................... 118/723 |
| 6,022,460 A | 2/2000 | O et al. ........................ 427/569 |
| 6,074,516 A | 6/2000 | Howald et al. ............... 118/723 |
| 6,076,482 A | 6/2000 | Ding et al. ................... 118/723 |
| 6,079,356 A * | 6/2000 | Umotoy et al. ........... 118/723 E |
| 6,089,182 A | 7/2000 | Hama ........................ 118/723 |

(Continued)

FOREIGN PATENT DOCUMENTS

JP            8-83696         3/1996

(Continued)

*Primary Examiner*—Parviz Hassanzadeh
*Assistant Examiner*—Michelle Crowell
(74) *Attorney, Agent, or Firm*—Wenderoth, Lind & Ponack, L.L.P.

(57) ABSTRACT

The interior of a vacuum chamber is maintained at a specified pressure by introducing a specified gas into the vacuum chamber having a plasma trap provided therein. Simultaneously, therewith, evacuation of the chamber is performed by a pump as an evacuating device, and a high-frequency power of 100 MHz is supplied to a counter electrode by counter-electrode use high-frequency power supply. Thus, uniform plasma is generated within the vacuum chamber, where plasma processing such as etching, deposition, and surface reforming can be carried out uniformly with a substrate placed on a substrate electrode.

15 Claims, 18 Drawing Sheets

U.S. PATENT DOCUMENTS

| | | | |
|---|---|---|---|
| 6,097,157 A | 8/2000 | Overzet et al. | 118/723 |
| 6,110,556 A * | 8/2000 | Bang et al. | 428/64.1 |
| 6,165,567 A | 12/2000 | Ventzek et al. | 427/576 |
| 6,184,158 B1 | 2/2001 | Shufflebotham et al. | 427/573 |
| 6,259,209 B1 | 7/2001 | Bhardwaj et al. | 118/723 |
| 6,346,915 B1 | 2/2002 | Okumura et al. | 118/723 |
| 6,539,891 B1 * | 4/2003 | Lee et al. | 118/723 E |
| 2002/0038791 A1 | 4/2002 | Okumura et al. | 216/71 |

FOREIGN PATENT DOCUMENTS

JP      10149995 A   *   6/1998

* cited by examiner

MEASUREMENT
POSITION

PLASMA PROCESSING METHOD AND APPARATUS

This application is a divisional application of Ser. No. 09/511,398, filed Feb. 23, 2000 now U.S. Pat. No. 6,808,759.

BACKGROUND OF THE INVENTION

The present invention relates to plasma processing methods such as dry etching, sputtering, and plasma CVD, as well as apparatuses therefor, to be used for manufacture of semiconductor or other electron devices and micromachines. More particularly, the present invention relates to a plasma processing method and apparatus for the use of plasma excited with high-frequency power of VHF or UHF band.

The present invention further relates to a matching box for a plasma processing apparatus to be used for impedance matching in supplying high-frequency power of VHF band, in particular, to a counter electrode for plasma excitation or to an antenna, and relates to a plasma processing method and apparatus using plasma excited with the high-frequency power of VHF band.

Japanese Laid-Open Patent Publication No. 8-83696 describes that the use of high-density plasma is important in order to meet the trend toward microstructures of semiconductors and other electron devices. Furthermore, low electron temperature plasma has recently been receiving attention by virtue of its high electron density and low electron temperature.

In the case where a gas having a high negativity, i.e., a gas that tends to generate negative ions, such as $Cl_2$, $SF_6$, is formed into plasma, when the electron temperature becomes about 3 eV or lower, larger amounts of negative ions are generated than with higher electron temperatures. Taking advantage of this phenomenon makes it possible to prevent etching configuration abnormalities, so-called notch, which may occur when positive charges are accumulated at the bottom of micro-patterns due to excessive incidence of positive ions. This allows etching of extremely micro patterns to be achieved with high precision.

Also, in the case where a gas containing carbon and fluorine, such as $C_xF_y$ or $C_xH_yF_z$ (where x, y, z are natural numbers), which is generally used for etching of insulating films such as silicon oxide, is formed into plasma, when the electron temperature becomes about 3 eV or lower, gas dissociation is suppressed more than with higher electron temperatures, where, in particular, generation of F atoms, F radicals and the like is suppressed. Because F atoms, F radicals and the like are higher in the rate of silicon etching, insulating film etching can be carried out at larger selection ratios than silicon etching with lower electron temperatures.

Also, when the electron temperature becomes 3 eV or lower, ion temperature and plasma potential also becomes lower, so that ion damage to the substrate in plasma CVD can be reduced.

As a technique capable of generating plasma having low electron temperature, plasma sources using high-frequency power of VHF band or UHF band are now receiving attention.

FIG. 15 is a sectional view of a dual-frequency excitation parallel-flat plate type plasma processing apparatus. Referring to FIG. 15, while the interior of a vacuum chamber 201 is maintained at a specified pressure by introducing a specified gas from a gas supply unit 202 into the vacuum chamber 201 and simultaneously performing evacuation by a pump 203 as an evacuating device, a high-frequency power of 100 MHz is supplied to a counter electrode 205 by a counter-electrode-use-high-frequency power supply 204. Then, plasma is generated in the vacuum chamber 201, where plasma processing such as etching, deposition, and surface reforming can be carried out on a substrate 207 placed on a substrate electrode 206. In this case, as shown in FIG. 15, by supplying high-frequency power also to the substrate electrode 206 by a substrate-electrode-use-high-frequency power supply 208, ion energy that reaches the substrate 207 can be controlled. In addition, the counter electrode 205 is insulated from the vacuum chamber 201 by an insulating ring 211.

FIG. 16 is a sectional view of a plasma processing apparatus which we have already proposed and which has an antenna type plasma source mounted thereon. Referring to FIG. 16, while the interior of a vacuum chamber 301 is maintained at a specified pressure by introducing a specified gas from a gas supply unit 302 into the vacuum chamber 301 and simultaneously performing evacuation by a pump 303 as an evacuating device, a high-frequency power of 100 MHz is supplied to a spiral antenna 313 on a dielectric window 314 by an antenna-use-high-frequency power supply 312. Then, plasma is generated in the vacuum chamber 301 by electromagnetic waves radiated into the vacuum chamber 301, where plasma processing such as etching, deposition, and surface reforming can be carried out on a substrate 307 placed on a substrate electrode 306. In this case, as shown in FIG. 16, by supplying high-frequency power also to the substrate electrode 306 by a substrate-electrode-use-high-frequency power supply 308, ion energy that reaches the substrate 307 can be controlled.

However, there has been an issue that the conventional methods shown in FIGS. 15 and 16 have difficulty in obtaining uniform plasma generation.

FIG. 17 shows results of measuring ion saturation current density at a position just 20 mm above the substrate 207 in the plasma processing apparatus of FIG. 15. Conditions for plasma generation are gas type of $Cl_2$ and gas flow rate of 100 sccm, a pressure of 1 Pa, and a high-frequency power of 2 kW. It can be understood from FIG. 17 that plasma density is higher in peripheral regions.

FIG. 18 shows results of measuring ion saturation current density at a position just 20 mm above the substrate 307 in the plasma processing apparatus of FIG. 16. Conditions for plasma generation are gas type of $Cl_2$ and gas flow rate of 100 sccm, a pressure of 1 Pa, and a high-frequency power of 2 kW. It can be understood from FIG. 18 that plasma density is higher in peripheral regions.

Such nonuniformity of plasma is a phenomenon that could not be seen with the frequency of the high-frequency power of 50 MHz or less. Whereas the 50 MHz or higher high-frequency power needs to be used in order to lower the electron temperature of plasma, there are produced, in this frequency band, not only an advantage that plasma is generated by the counter electrode or antenna being capacitively or inductively coupled to the plasma, but also an advantage that plasma is generated by electromagnetic waves, which are radiated from the counter electrode or antenna, propagating on the surface of the plasma. In peripheral regions of the vacuum chamber, which serve as reflecting surfaces for the electromagnetic waves that have propagated on the surface of the plasma, stronger electric fields are developed so that thick plasma is generated.

Also, as described above, in the case where a gas having a high negativity, i.e., a gas that tends to generate negative ions, such as $Cl_2$, $SF_6$, is formed into plasma, when the electron temperature becomes about 3 eV or lower, larger amounts of negative ions are generated than with higher electron temperatures. Taking advantage of this phenomenon makes it possible to prevent a phenomenon that perpendicularity of the incident angle of ions onto the substrate worsens when positive charges are accumulated at the bottom of micro-patterns due to excessive incidence of positive ions. This allows etching of extremely micro patterns to be achieved with high precision. Besides, that is an expectation for process improvement making use of the high reactivity of negative ions.

Also, in the case where a gas containing carbon and fluorine, such as $C_xF_y$ or $C_xH_yF_z$ (where x, y, z are natural numbers), which is generally used for etching of insulating films such as silicon oxide, is formed into plasma, when the electron temperature becomes about 3 eV or lower, gas dissociation is suppressed more than with higher electron temperatures, where, in particular, generation of F atoms, F radicals and the like is suppressed. Because F atoms, F radicals and the like are higher in the rate of silicon etching, insulating film etching can be carried out at larger selection ratios than silicon etching with lower electron temperatures.

Also, when the electron temperature becomes 3 eV or lower, ion temperature and plasma potential also become lower, so that ion damage to the substrate in plasma CVD can be reduced.

It is plasma sources using high-frequency power of VHF band that is currently receiving attention as a technique capable of generating plasma low in electron temperature and capable of generating plasma superior in ignitability.

FIG. 24 is a sectional view of a dual-frequency excitation parallel-flat plate type plasma processing apparatus. Referring to FIG. 24, while the interior of a vacuum chamber 401 is maintained at a specified pressure by introducing a specified gas from a gas supply unit 402 into the vacuum chamber 401 and simultaneously performing evacuation by a pump 403 as an evacuating device, a high-frequency power of 100 MHz is supplied to a counter electrode 407 via a matching box 405 and a high-frequency coupling device (mount) 406 by a counter-electrode-use-high-frequency power supply 404. Then, plasma is generated in the vacuum chamber 401, where plasma processing such as etching, deposition, and surface reforming can be carried out on a substrate 409 placed on a substrate electrode 408. In this case, as shown in FIG. 24, by also supplying high-frequency power to the substrate electrode 408 by a substrate-electrode-use-high-frequency power supply 410, ion energy that reaches the substrate 409 can be controlled. In addition, the counter electrode 407 is insulated from the vacuum chamber 401 by an insulating ring 411. The matching box 405 comprises a high-frequency input terminal 412, a first variable capacitor 413, a high-frequency output terminal 414, a second variable capacitor 415, a first motor 416, a second motor 417, and a motor control circuit 418.

However, there has been an issue that the conventional method shown in FIG. 24 has difficulty in obtaining uniform plasma generation.

FIG. 25 shows results of measuring ion saturation current density at a position just 20 mm above the substrate 409 in the plasma processing apparatus of FIG. 24. Conditions for plasma generation are gas type of $Cl_2$ and gas flow rate of 100 sccm, a pressure of 2 Pa and a high-frequency power of 1 kW. Also, as shown in FIG. 24, the second variable capacitor 415 is disposed on one side of the measuring position in FIG. 25. It can be understood from FIG. 25 that plasma density is higher on one side of the measuring position, i.e., just below the second variable capacitor 415.

Such nonuniformity of plasma is a phenomenon that could not be seen with the frequency of the high-frequency power of 50 MHz or less. Whereas the 50 MHz or higher high-frequency power needs to be used in order to lower the electron temperature of plasma, there develops, in this frequency band, a potential distribution in the counter electrode 407. It can be deduced that this potential distribution, affected by the placement of the second variable capacitor 415 within the matching box 405, acts to strengthen the electric fields just below the second variable capacitor 415, resulting in nonuniformity of plasma generation.

Such a phenomenon could be seen with such an arrangement as shown in FIG. 26 in which a spiral antenna 420 is used instead of the counter electrode 407. In the prior art example shown in FIG. 26, a dielectric window 421 is used.

SUMMARY OF THE INVENTION

In view of these issues of the prior art, an object of the present invention is to provide a plasma processing method and apparatus, as well as a matching box for a plasma processing apparatus, capable of generating uniform plasma.

In order to achieve the above object, the present invention has the following constitutions.

In accomplishing these and other aspects, according to a 1st aspect of the present invention, there is provided a plasma processing method for generating plasma within a vacuum chamber and processing a substrate placed on a substrate electrode within the vacuum chamber. The method comprises generating the plasma by supplying a high-frequency power having a frequency of 50 MHz to 3 GHz to a counter electrode provided opposite to the substrate while interior of the vacuum chamber is controlled to a specified pressure by introducing gas into the vacuum chamber and, simultaneously therewith, evacuating the interior of the vacuum chamber. The substrate is processed using the generated plasma while plasma distribution of the plasma on the substrate is controlled by an annular, groove-like plasma trap provided opposite to the substrate.

According to a 2nd aspect of the present invention, there is provided a plasma processing method for generating plasma within a vacuum chamber and processing a substrate placed on a substrate electrode within the vacuum chamber. The method comprises generating the plasma by radiating electromagnetic waves into the vacuum chamber via a dielectric window provided opposite to the substrate by supplying a high-frequency power having a frequency of 50 MHz to 3 GHz to an antenna while the interior of the vacuum chamber is controlled at a specified pressure by introducing gas into the vacuum chamber and, simultaneously therewith, evacuating the interior of the vacuum chamber. The substrate is processed using the generated plasma while plasma distribution of the plasma on the substrate is controlled by an annular, groove-like plasma trap provided opposite to the substrate.

According to a 3rd aspect of the present invention, there is provided a plasma processing method according to the 1st aspect, wherein the substrate is processed while a portion surrounded by the plasma trap out of a surface forming an inner wall surface of the vacuum chamber and opposing the substrate has an area 0.5 to 2.5 times that of the substrate.

According to a 4th aspect of the present invention, there is provided a plasma processing method according to the 1st aspect, wherein the substrate is processed while the plasma trap has a groove width of 3 mm to 50 mm.

According to a 5th aspect of the present invention, there is provided a plasma processing method according to the 1st aspect, wherein the substrate is processed while the plasma has a groove depth of not less than 5 mm.

According to a 6th aspect of the present invention, there is provided a plasma processing method according to the 1st aspect, wherein the substrate is processed while the plasma trap is provided in the counter electrode.

According to a 7th aspect of the present invention, there is provided a plasma processing method according to the 1st aspect, wherein the plasma is generated while the plasma trap is provided outside an insulating ring for insulating the vacuum chamber and the counter electrode from each other.

According to an 8th aspect of the present invention, there is provided a plasma processing method according to the 1st aspect, wherein the plasma is generated while the plasma trap is provided between the counter electrode and an insulating ring for insulating the vacuum chamber and the counter electrode from each other.

According to a 9th aspect of the present invention, there is provided a plasma processing method according to the 1st aspect, wherein the plasma is generated while the plasma trap is provided between the vacuum chamber and an insulating ring for insulating the vacuum chamber and the counter electrode from each other.

According to a 10th of the present invention, there is provided a plasma processing method according to the 2nd aspect, wherein the plasma is generated while the plasma trap is provided in the dielectric window.

According to an 11th aspect of the present invention, there is provided a plasma processing method according to the 2nd aspect, wherein the plasma is generated while the plasma trap is provided outside the dielectric window.

According to a 12th aspect of the present invention, there is provided a plasma processing method according to the 2nd aspect, wherein the plasma is generated while the plasma trap is provided between the vacuum chamber and the dielectric window.

According to a 13th aspect of the present invention, there is provided a plasma processing method according to the 1st aspect, wherein the plasma is generated while DC magnetic fields are absent within the vacuum chamber.

According to a 14th aspect of the present invention, there is provided a plasma processing apparatus comprising a vacuum chamber; a gas supply unit for supplying gas into the vacuum chamber; an evacuating device for evacuating the interior of the vacuum chamber; a substrate electrode for placing thereon a substrate within the vacuum chamber; a counter electrode provided opposite to the substrate electrode; high-frequency power supply capable of supplying a high-frequency power having a frequency of 50 MHz to 3 GHz to the counter electrode; and an annular, groove-like plasma trap provided opposite to the substrate.

According to a 15th aspect of the present invention, there is provided a plasma processing apparatus comprising: a vacuum chamber; a gas supply unit for supplying gas into the vacuum chamber; an evacuating device for evacuating the interior of the vacuum chamber; a substrate electrode for placing thereon a substrate within the vacuum chamber; a dielectric window provided opposite to the substrate electrode; an antenna for radiating electromagnetic waves into the vacuum chamber via the dielectric window; a high-frequency power supply capable of supplying a high-frequency power having a frequency of 50 MHz to 3 GHz to the antenna; and an annular, groove-like plasma trap provided opposite to the substrate.

According to a 16th aspect of the present invention, there is provided a plasma processing apparatus according to the 14th aspect, wherein a portion surrounded by the plasma trap out of a surface forming an inner wall surface of the vacuum chamber and opposing the substrate has an area 0.5 to 2.5 times that of the substrate.

According to a 17th aspect of the present invention, there is provided a plasma processing apparatus according to the 14th aspect, wherein the plasma trap has a groove width of 3 mm to 50 mm.

According to a 18th aspect of the present invention, there is provided a plasma processing apparatus according to the 14th or 15th aspect, wherein the plasma trap has a groove depth of not less than 5 mm.

According to a 19th aspect of the present invention, there is provided a plasma processing apparatus according to the 14th aspect, wherein the plasma trap is provided in the counter electrode.

According to a 20th aspect of the present invention, there is provided a plasma processing apparatus according to the 14th aspect, wherein the plasma trap is provided in an insulating ring for insulating the vacuum chamber and the counter electrode from each other.

According to a 21st aspect of the present invention, there is provided a plasma processing apparatus according to the 14th aspect, wherein the plasma trap is provided outside an insulating ring for insulating the vacuum chamber and the counter electrode from each other.

According to a 22nd aspect of the present invention, there is provided a plasma processing apparatus according to the 14th aspect, wherein the plasma trap is provided between the counter electrode and an insulating ring for insulating the vacuum chamber and the counter electrode from each other.

According to a 23rd aspect of the present invention, there is provided a plasma processing apparatus according to the 14th aspect, wherein the plasma trap is provided between the vacuum chamber and an insulating ring for insulating the vacuum chamber and the counter electrode from each other.

According to a 24th aspect of the present invention, there is provided a plasma processing apparatus according to the 15th aspect, wherein the plasma trap is provided in the dielectric window.

According to a 25th aspect of the present invention, there is provided a plasma processing apparatus according to the 15th aspect, wherein the plasma trap is provided outside the dielectric window.

According to a 26th aspect of the present invention, there is provided a plasma processing apparatus according to the 15th aspect, wherein the plasma trap is provided between the vacuum chamber and the dielectric window.

According to a 27th aspect of the present invention, there is provided a plasma processing apparatus according to the 14th aspect, wherein no coil or permanent magnet for applying DC magnetic fields is provided within the vacuum chamber.

According to a 28th aspect of the present invention, there is provided a plasma processing apparatus according to the 1st aspect, further comprising a matching box for use in the plasma processing apparatus and for taking impedance matching in supplying high-frequency power to a load. The matching box comprises a high-frequency input terminal; a first reactive element having one end connected to the high-frequency input terminal and the other end connected to a matching box casing; a high-frequency output terminal; and a second reactive element having one end connected to the high-frequency input terminal and the other end connected to the high-frequency output terminal. The second reactive element and the high-frequency output terminal are so arranged that the second reactive element is located on a straight line passing through a center axis of the high-frequency output terminal.

According to a 29th aspect of the present invention, there is provided a plasma processing apparatus according to the 28th aspect, wherein the first reactive element and the second reactive element are capacitors, respectively.

According to a 30th aspect of the present invention, there is provided a matching box for use in a plasma processing apparatus and for taking impedance matching in supplying high-frequency power to a load. The matching box comprises a high-frequency input terminal; a first reactive element having one end connected to the high-frequency input terminal and the other end connected to a matching box casing; a high-frequency output terminal; and a second reactive element having one end connected to the high-frequency input terminal and the other end connected to the high-frequency output terminal. The second reactive element and the high-frequency output terminal are so arranged that the second reactive element is located on a straight line passing through a center axis of the high-frequency output terminal.

According to a 31st aspect of the present invention, there is provided a matching box for a plasma processing apparatus according to the 30th aspect, wherein the second reactive element and the high-frequency output terminal are arranged so that a straight line passing through a center axis of the second reactive element and a straight line passing through the center axis of the high-frequency output terminal are generally coincident with each other.

According to a 32nd aspect of the present invention, there is provided a matching box for a plasma processing apparatus according to the 30th aspect, wherein the first reactive element and the second reactive element are capacitors, respectively.

According to a 33rd aspect of the present invention, there is provided a matching box for a plasma processing apparatus according to the 30th aspect, wherein the first reactive element and the second reactive element are arranged so that a straight line passing through a center axis of the second reactive element and a straight line passing through a center axis of the first reactive element are generally coincident with each other.

According to a 34th aspect of the present invention, there is provided a matching box for a plasma processing apparatus according to the 30th aspect, wherein the high-frequency output terminal is the other end itself of the second reactive element.

According to a 35th aspect of the present invention, there is provided a plasma processing method for generating plasma within a vacuum chamber and processing a substrate placed on a substrate electrode within the vacuum chamber. The method comprises arranging a straight line passing through a center axis of the high-frequency coupling device, a straight line passing through a center axis of the counter electrode or antenna, and a straight line passing through a center axis of the substrate so as to be generally coincident together. The interior of the vacuum chamber maintained at a specified pressure by introducing a gas into the vacuum chamber and, simultaneously therewith, exhausting the interior of the vacuum chamber. The plasma is generated by applying a high-frequency power having a frequency of 50 MHz to 300 MHz to a counter electrode or antenna provided opposite to the substrate via the matching box as defined in the 30th aspect and a high-frequency coupling device provided to connect a high-frequency output terminal of the matching box and the counter electrode or antenna to each other. The substrate is then processed by using generated plasma.

According to a 36th aspect of the present invention, there is provided a plasma processing method according to the 35th aspect, in which the following additional steps are accomplished before maintaining the interior of the vacuum chamber at the specified pressure. A straight line passing through a center axis of the high-frequency output terminal and a straight line passing through the center axis of the high-frequency coupling device as arranged so as to be generally coincident with each other. The plasma is generated with the straight line passing through the center axis of the high-frequency output terminal and the straight line passing through the center axis of the high-frequency coupling device being generally coincident with each other.

According to a 37th aspect of the present invention, there is provided a plasma processing method according to the 35th aspect, in which the following additional steps are accomplishing before maintaining the interior of the vacuum chamber at the specified pressure. The first reactive element and the second reactive element are arranged so that a straight line passing through a center axis of the second reactive element and a straight line passing through a center axis of the first reactive element are generally coincident with each other. The plasma is generated with the straight line passing through the center axis of the second reactive element and the straight line passing through the center axis of the first reactive element being generally coincident with each other.

According to a 38th aspect of the present invention, there is provided a plasma processing method according to the 35th aspect, in which before maintaining the interior of the vacuum chamber at the specified pressure, the high-frequency output terminal is arranged so as to be the other end itself of the second reactive element, and the plasma is generated with the high-frequency output terminal being the other end itself of the second reactive element.

According to a 39th aspect of the present invention, there is provided a plasma processing method according to the 35th aspect, in which before controlling the interior of the vacuum chamber at the specified pressure, a substantial distance is arranged from the other end of the second reactive element to the counter electrode or antenna so as not to be more than $1/10$ of the wavelength of the high-frequency power. The plasma is generated with the substantial distance from the other end of the second reactive element to the counter electrode or antenna being not more than $1/10$ of the wavelength of the high-frequency power.

According to a 40th aspect of the present invention, there is provided a plasma processing method for generating plasma within a vacuum chamber and processing a substrate placed on a substrate electrode within the vacuum chamber. The method comprises arranging a straight line passing through a center axis of the high-frequency coupling device, a straight line passing through a center axis of the counter electrode or antenna, and a straight line passing through a center axis of the substrate so as to be generally coincident together. The interior of the vacuum chamber is maintained at a specified pressure by introducing a gas into the vacuum chamber and, simultaneously therewith, the interior of the vacuum chamber is exhausted. The plasma is generated by applying a high-frequency power having a frequency of 50 MHz to 300 MHz to a counter electrode or antenna provided opposite to the substrate via the matching box as defined in the 30th aspect and a high-frequency coupling device provided to connect a high-frequency output terminal of the matching box and the counter electrode or antenna to each other, and the substrate is processed by using the generated plasma.

According to a 41st aspect of the present invention, there is provided a plasma processing method according to the 40th aspect, in which before controlling the interior of the vacuum chamber to the specified pressure, a straight line passing through a center axis of the high-frequency output terminal and a straight line passing through the center axis of the high-frequency coupling device are arranged so as to be generally coincident with each other. The plasma is generated with the straight line passing through the center axis of the high-frequency output terminal and the straight line passing through the center axis of the high-frequency coupling device being generally coincident with each other.

According to a 42nd aspect of the present invention, there is provided a plasma processing method according to the 40th aspect, in which before controlling the interior of the vacuum chamber at the specified pressure, the first variable capacitor and the second variable capacitor are arranged that a straight line passing through a center axis of the second variable capacitor and a straight line passing through a center axis of the first variable capacitor are generally coincident with each other. The plasma is generated with the straight line passing through the center axis of the second variable capacitor and the straight line passing through the center axis of the first variable capacitor being generally coincident with each other.

According to a 43rd aspect of the present invention, there is provided a plasma processing method according to the 40th aspect, in which before controlling the interior of the vacuum chamber to the specified pressure, the high-frequency output terminal is arranged so as to be the other end itself of the second reactive element. The plasma is generated with the high-frequency output terminal being the other end itself of the second variable capacitor.

According to a 44th aspect of the present invention, there is provided a plasma processing method according to the 40th aspect, in which before controlling the interior of the vacuum chamber to the specified pressure, a substantial distance is arranged from the other end of the second variable capacitor to the counter electrode or antenna so as to be not more than $1/10$ of wavelength of the high-frequency power. The plasma is generated with the substantial distance from the other end of the second variable capacitor to the counter electrode or antenna to be not more than $1/10$ of wavelength of the high-frequency power.

According to a 45th aspect of the present invention, there is provided a plasma processing apparatus comprising: a vacuum chamber; a gas supply unit for supplying gas into the vacuum chamber; an evacuating device for evacuating the interior of the vacuum chamber; a substrate electrode for placing thereon a substrate within the vacuum chamber; a counter electrode or an antenna provided opposite to the substrate electrode; a high-frequency power supply capable of supplying a high-frequency power having a frequency of 50 MHz to 300 MHz to the counter electrode or antenna; the matching box as defined in the 30th aspect; and a high-frequency coupling device for connecting the high-frequency output terminal of the matching box and the counter electrode or antenna to each other. A straight line passing through a center axis of the high-frequency coupling device, a straight line passing through a center axis of the counter electrode or antenna, and a straight line passing through a center axis of the substrate are arranged so as to be generally coincident together.

According to a 46th aspect of the present invention, there is provided a plasma processing apparatus according to the 45th aspect, wherein a straight line passing through a center axis of the high-frequency output terminal and a straight line passing through the center axis of the high-frequency coupling device are arranged so as to be generally coincident with each other.

According to a 47th aspect of the present invention, there is provided a plasma processing apparatus according to the 45th aspect, wherein the first reactive element and the second reactive element are arranged so that a straight line passing through a center axis of the second reactive element and a straight line passing through a center axis of the first reactive element are generally coincident with each other.

According to a 48th aspect of the present invention, there is provided a plasma processing apparatus according to the 45th aspect, wherein the high-frequency output terminal is the other end itself of the second reactive element.

According to a 49th aspect of the present invention, there is provided a plasma processing apparatus according to the 45th aspect, wherein substantial distance from the other end of the second reactive element to the counter electrode or antenna is not more than $1/10$ of wavelength of the high-frequency power.

According to a 50th aspect of the present invention, there is provided a plasma processing apparatus comprising a vacuum chamber; a gas supply unit for supplying gas into the vacuum chamber; an evacuating device for evacuating the interior of the vacuum chamber; a substrate electrode for placing thereon a substrate within the vacuum chamber; a counter electrode or an antenna provided opposite to the substrate electrode; a high-frequency power supply capable of supplying a high-frequency power having a frequency of 50 MHz to 300 MHz to the counter electrode or antenna; the matching box as defined in the 30th aspect; and a high-frequency coupling device for connecting the high-frequency output terminal of the matching box and the counter electrode or antenna to each other. A straight line passing through a center axis of the high-frequency coupling device, a straight line passing through a center axis of the counter electrode or antenna, and a straight line passing through a center axis of the substrate are arranged so as to be generally coincident together.

According to a 51st aspect of the present invention, there is provided a plasma processing apparatus according to the 50th aspect, wherein the plasma is generated while the straight line passing through the center axis of the high-frequency output terminal and the straight line passing through the center axis of the high-frequency coupling device are arranged so as to be generally coincident with each other.

According to a 52nd aspect of the present invention, there is provided a plasma processing apparatus according to the 50th aspect, wherein a first variable capacitor and a second variable capacitor are arranged so that a straight line passing through a center axis of the second variable capacitor and a straight line passing through a center axis of the first variable capacitor are generally coincident with each other.

According to a 53rd aspect of the present invention, there is provided a plasma processing apparatus according to the 50th aspect, wherein the high-frequency output terminal is the other end itself of the second variable capacitor.

According to a 54th aspect of the present invention, there is provided a plasma processing apparatus according to the 50th aspect, wherein a substantial distance from the other end of the second variable capacitor to the counter electrode or antenna is not more than $1/10$ of the wavelength of the high-frequency power.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1A:
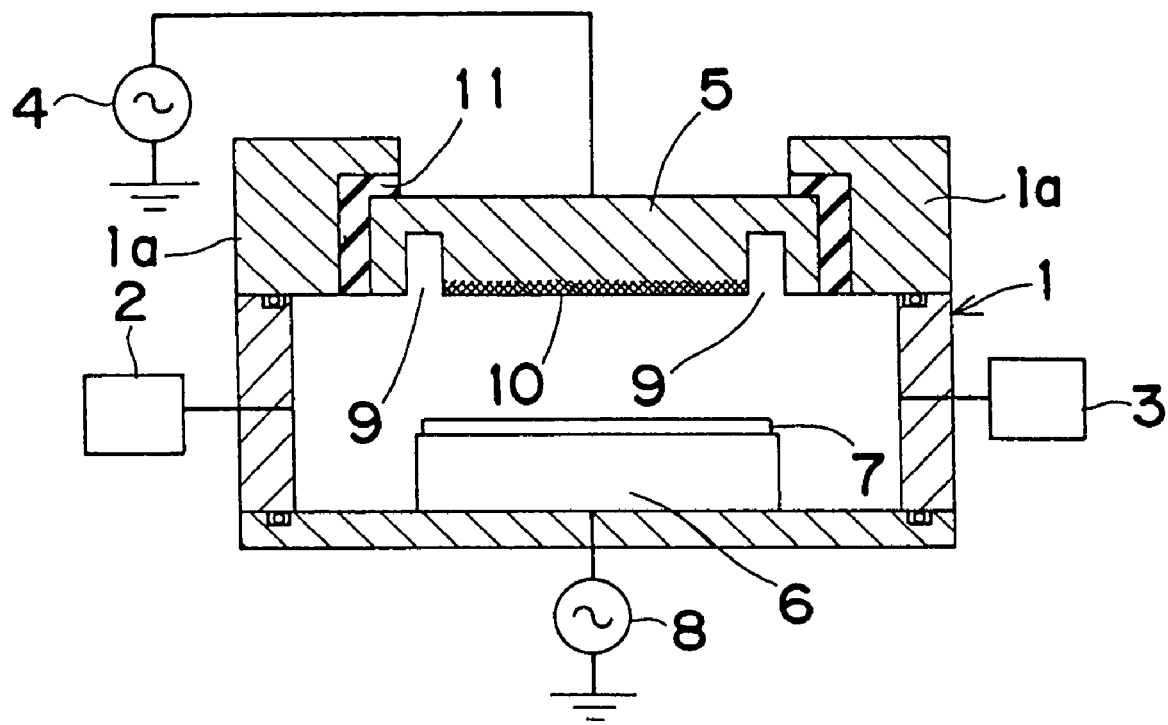
FIG. 1A is a sectional view showing the constitution of a plasma processing apparatus employed in a first embodiment of the present invention.

Before the description of the present invention proceeds, it is to be noted that like parts are designated by like reference numerals throughout the accompanying drawings.

Hereinbelow, embodiments according to the present invention are described in detail with reference to the accompanying drawings.

A first embodiment of the present invention is described below with reference to FIGS. 1A, 1B, and 2.

Figure 1B:
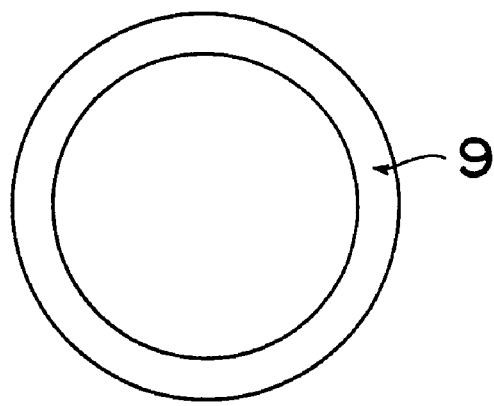
FIG. 1B is a plan view of plasma trap of the plasma processing apparatus of FIG. 1A.

FIG. 1A shows a sectional view of a plasma processing apparatus employed in the first embodiment of the present invention. Referring to FIG. 1A, while the interior of a vacuum chamber 1 is maintained at a specified pressure by introducing a specified gas from a gas supply unit 2 into the vacuum chamber 1 and by simultaneously performing evacuation by a pump 3 as an evacuating device, a high-frequency power of 100 MHz is supplied to a counter electrode 5 by a counter-electrode-use-high-frequency power supply 4. Then, plasma is generated in the vacuum chamber 1, where plasma processing such as etching, deposition, and surface reforming can be carried out on a substrate 7 placed on a substrate electrode 6. A substrate-electrode-use-high-frequency power supply 8 for supplying high-frequency power to the substrate electrode 6 is also provided, so that ion energy that reaches the substrate 7 can be controlled. Also, an annular, groove-like plasma trap 9 shown in FIGS. 1A and 1B is provided opposite to the substrate 7, making it possible to process the substrate 7 while the plasma distribution on the substrate 7 is controlled. The plasma trap 9 is provided in the counter electrode 5. Out of surfaces forming inner wall surfaces of the vacuum chamber 1 and opposing the substrate 7, an electrode portion 10 (cross hatched portion) surrounded by the plasma trap 9 has an area 0.8 time that of the substrate 7, as one example. Also, the groove width of the plasma trap 9 is 10 mm, and the groove depth of the plasma trap 9 is 15 mm, as one example. In addition, the counter electrode 5 is insulated from the vacuum chamber 1 by an insulating ring 11. As shown in FIG. 1A (as well as the other Figures), the annular groove (plasma trap) 9 has a bottom face, an outer-side face closest to the side wall of the vacuum chamber 1, and an inner-side face farthest from the side wall of the vacuum chamber 1. As can be seen, the outer-side face of the annular groove 9 is located "inside" of the inner surface of the side wall of the vacuum chamber. In this regard, the terms "inside" and "outside" mean closer to, and farther from, respectively, a vertical center axis of the vacuum chamber.

Figure 2:
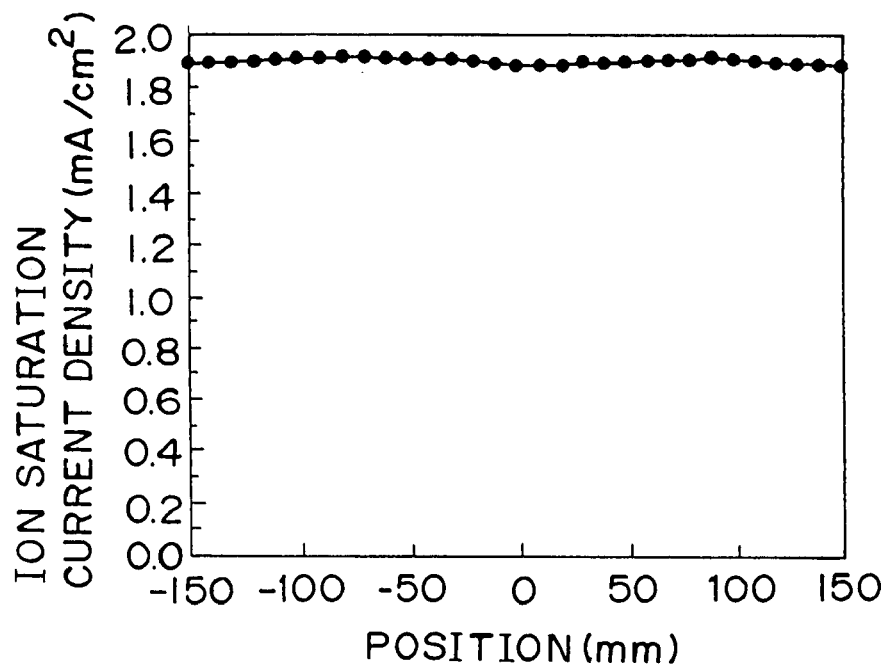
FIG. 2 is a chart showing measuring results of ion saturation current density in the first embodiment of the present invention.
Figure 17:
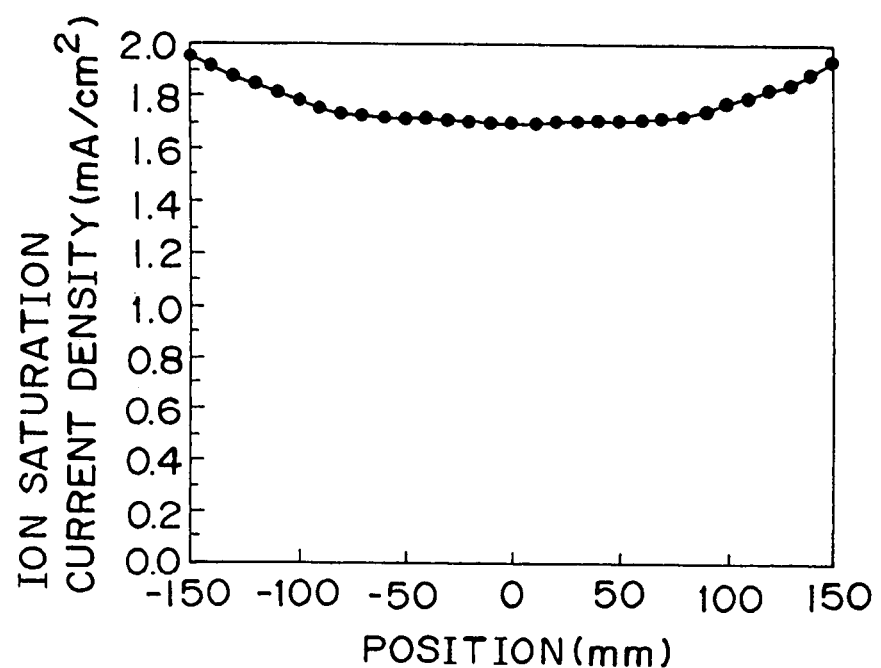
FIG. 17 is a chart showing measuring results of ion saturation current density in a prior art example.

FIG. 2 shows measuring results of ion saturation current density at a position just 20 mm above the substrate 7. Conditions for plasma generation are gas type of C12 and gas flow rate of 100 sccm, a pressure of 1 Pa, and a high-frequency power of 2 kW, as one example. It can be understood from FIG. 2 that the tendency for plasma to be richer in peripheral regions as shown in FIG. 17 is suppressed, and that uniform plasma is generated.

Figure 15:
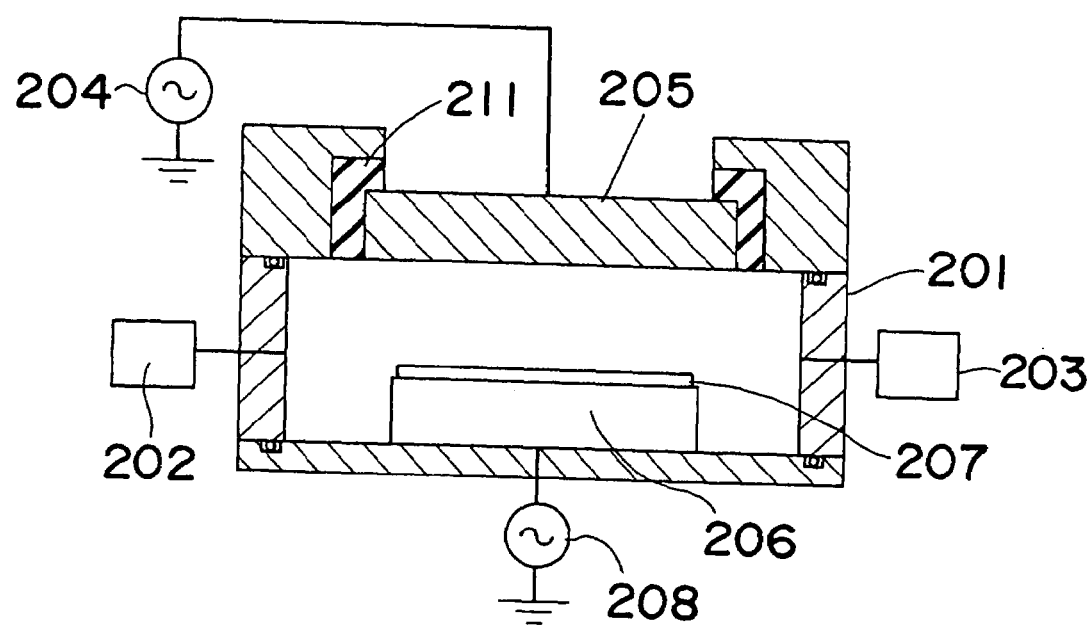
FIG. 15 is a sectional view showing the constitution of a plasma processing apparatus employed in a prior art example.

The reason why the uniformity of plasma is improved like this as compared with the plasma processing apparatus shown in FIG. 15 of the prior art example could be considered as follows. Electromagnetic waves radiated from the counter electrode 5 are intensified by the plasma trap 9. Also, since plasma of low electron temperature tends to cause hollow cathode discharge, high density plasma (hollow cathode discharge) is more likely to be generated by the plasma trap 9 surrounded by the solid surfaces. Accordingly, in the vacuum chamber 1, plasma density becomes the highest at the plasma trap 9, and through transport of plasma to vicinities of the substrate 7 by diffusion, uniform plasma can be obtained.

In addition, the hollow cathode discharge is as described below. Generally, because a solid surface in contact with plasma is negatively charged due to differences in thermal motion velocity between electrons and ions, DC electric fields that repel electrons from the solid surface are generated on the solid surface. In a space surrounded by solid surfaces, as in the plasma trap 9 illustrated in the first embodiment of the present invention, the probability of electrons colliding with the solid surfaces is lowered by the presence of the DC electric fields, prolonging the life of the electrons. As a result, high-density plasma is generated in the plasma trap 9. Such a discharge is referred to as hollow cathode discharge.

The first embodiment of the present invention has been described above for the case where the plasma trap 9 is provided in the counter electrode 5. In this case, however, there is a possibility that a self-bias voltage developed at the counter electrode 5 causes high-density ions present in the plasma trap 9 to collide with the counter electrode 5 at a high energy level so that sputtering of the counter electrode 5 may occur. The sputtering of the counter electrode 5 may shorten the life of the counter electrode 5 or mix impurities into the substrate 7, thus being undesirable. This can be avoided by providing the plasma trap in portions other than the counter electrode 5. For example, the plasma trap 9 may be provided in the insulating ring 11 as shown in a second embodiment of FIG. 3. Also, the plasma trap 9 may be provided outside the insulating ring 11, that is, in a metallic upper wall 1a of the vacuum chamber 1 as shown in a third embodiment of FIG. 4. Further, when the plasma trap 9 is provided between the counter electrode 5 and the insulating ring 11 as shown in a fourth embodiment of FIG. 5 or a fifth embodiment of FIG. 6, improvement can be attained more or less. Furthermore, the plasma trap 9 may be provided between the upper wall 1a of the vacuum chamber 1 and the insulating ring 11 as shown in a sixth embodiment of FIG. 7.

Figure 3:
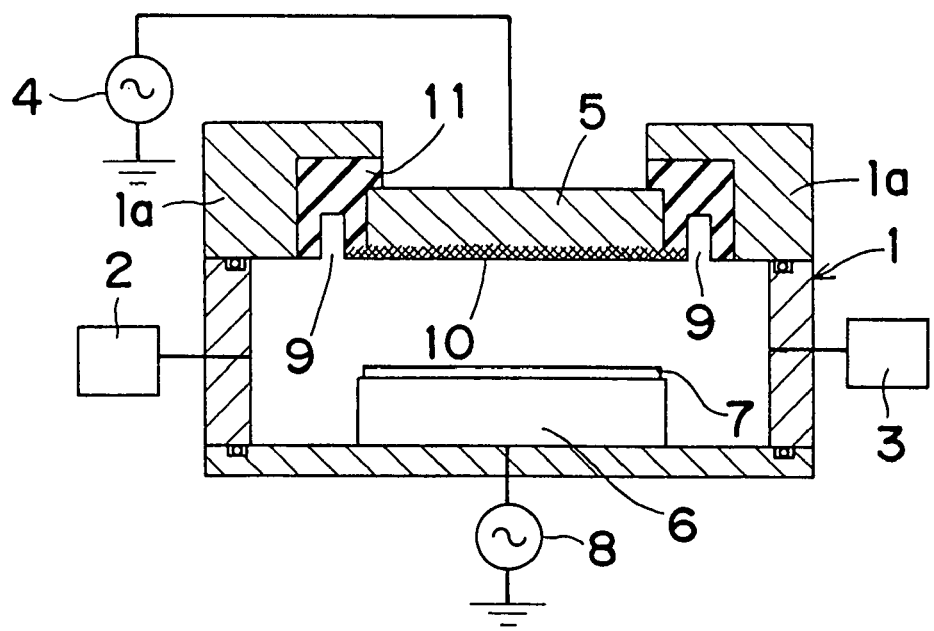
FIG. 3 is a sectional view showing the constitution of a plasma processing apparatus employed in a second embodiment of the present invention.
Figure 4:
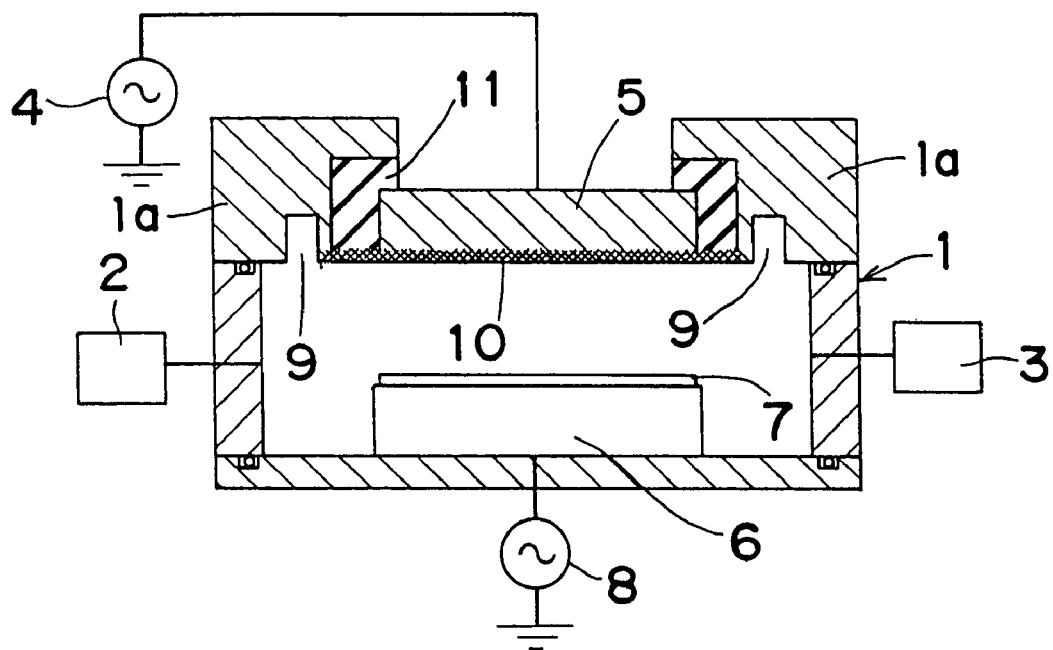
FIG. 4 is a sectional view showing the constitution of a plasma processing apparatus employed in a third embodiment of the present invention.
Figure 5:
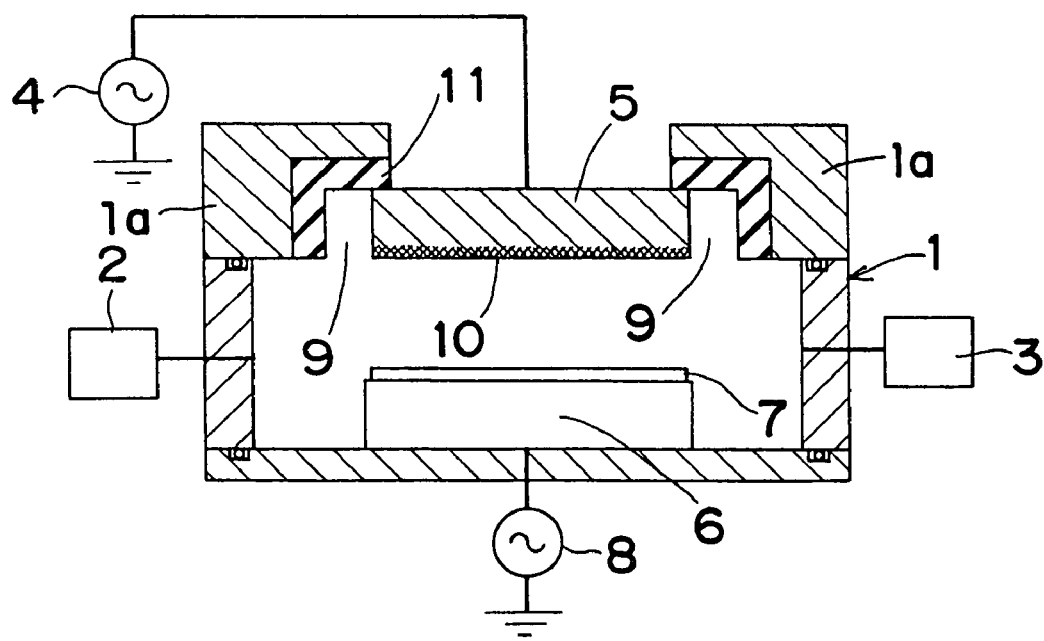
FIG. 5 is a sectional view showing the constitution of a plasma processing apparatus employed in a fourth embodiment of the present invention.
Figure 6:
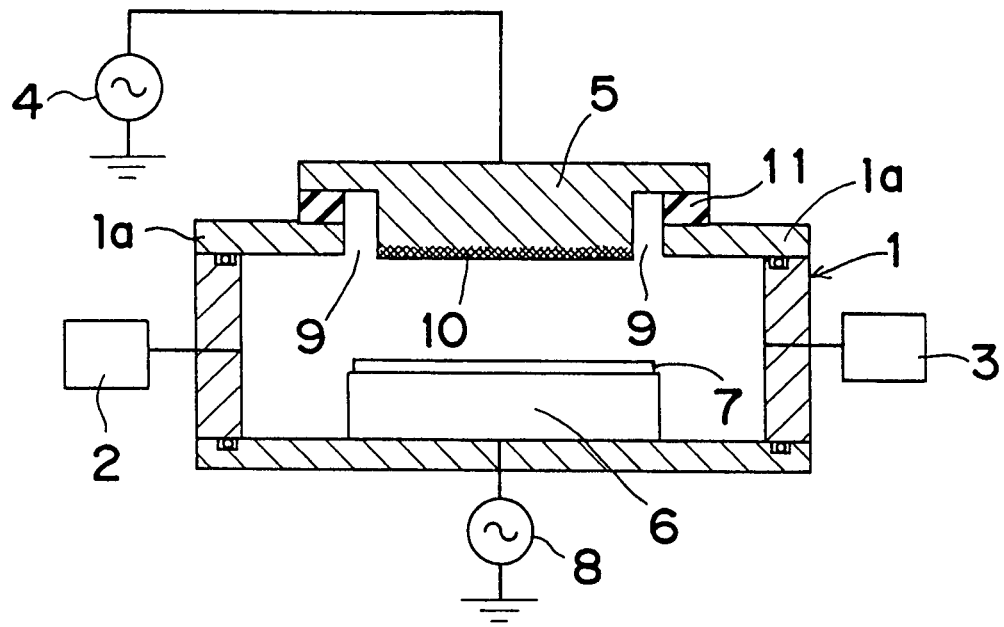
FIG. 6 is a sectional view showing the constitution of a plasma processing apparatus employed in a fifth embodiment of the present invention.
Figure 7:
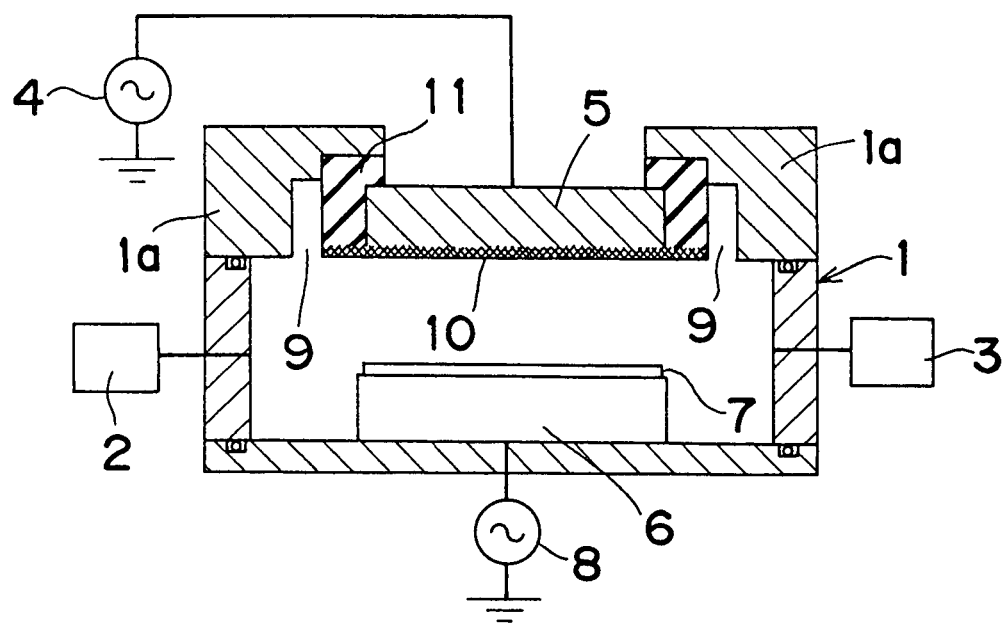
FIG. 7 is a sectional view showing the constitution of a plasma processing apparatus employed in a sixth embodiment of the present invention.

In FIG. 1A, the plasma trap 9 is defined by three faces, that is, an inner face, an upper face, and an outer face of the counter electrode 5. In FIG. 3, the plasma trap 9 is defined by three faces, that is, an inner face, an upper face, and an outer face of the insulating ring 11. In FIG. 4, the plasma trap 9 is defined by three faces, that is, an inner face, an upper face, and an outer face of the upper wall 1a of the vacuum chamber 1. In FIG. 5, the plasma trap 9 is defined by an inner face formed on the counter electrode 5 and an upper face and an outer face formed on the insulating ring 11. In FIG. 6, the plasma trap 9 is defined by an inner face and an upper face formed on the counter electrode 5 and an outer face formed on the insulating ring 11 and the upper wall 1a of the vacuum chamber 1. In FIG. 7, the plasma trap 9 is defined by an inner face formed on the insulating ring 11 and an upper face and an outer face formed on the upper wall 1a of the vacuum chamber 1.

Next, a seventh embodiment of the present invention is described with reference to FIGS. 8 and 9.

Figure 8:
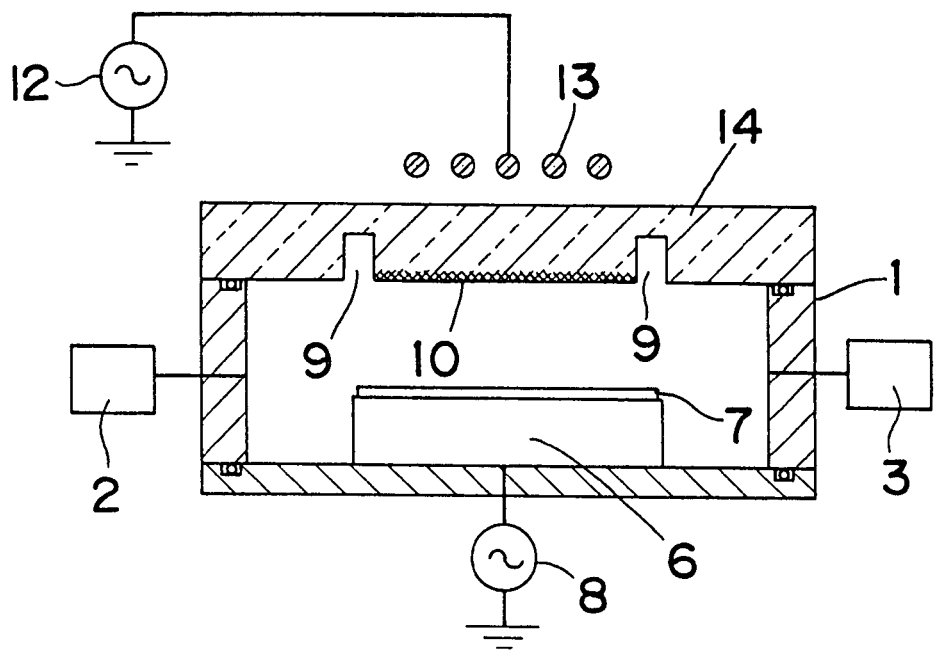
FIG. 8 is a sectional view showing the constitution of a plasma processing apparatus employed in a seventh embodiment of the present invention.

FIG. 8 shows a sectional view of a plasma processing apparatus employed in the seventh embodiment of the present invention. Referring to FIG. 8, while the interior of a vacuum chamber 1 is maintained at a specified pressure by introducing a specified gas from a gas supply unit 2 into the vacuum chamber 1 and simultaneously performing evacuation by a pump 3 as an evacuating device, a high-frequency power of 100 MHz is supplied to a spiral antenna 13 by an antenna-use-high-frequency power supply 12, and electromagnetic waves are radiated into the vacuum chamber 1 via a dielectric window 14 provided opposite the substrate 7 placed on the substrate electrode 6. Then, plasma is generated in the vacuum chamber 1, where plasma processing such as etching, deposition, and surface reforming can be carried out on the substrate 7. A substrate-electrode-use-high-frequency power supply 8 for supplying high-frequency power to the substrate electrode 6 is provided, so that ion energy that reaches the substrate 7 can be controlled. Also, an annular, groove-like plasma trap 9 provided opposite to the substrate 7 makes it possible to process the substrate 7 while the plasma distribution on the substrate 7 is controlled. The plasma trap 9 is provided in the dielectric window 14 so as to be defined by an inner, an upper, and an outer faces formed in the dielectric window 14. Out of surfaces of the vacuum chamber 1 opposing the substrate 7, a wall portion 10 (cross hatched portion) surrounded by the plasma trap 9 has an area 0.8 time that of the substrate 7, as one example. Also, the groove width of the plasma trap 9 is 10 mm, and the groove depth of the plasma trap 9 is 15 mm, as one example.

Figure 9:
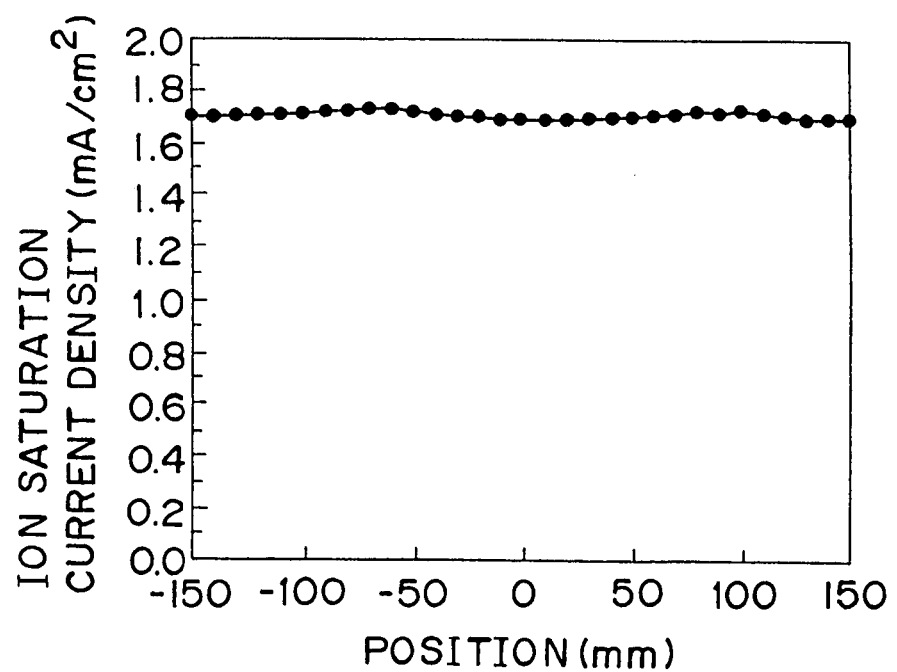
FIG. 9 is a chart showing measuring results of ion saturation current density in the seventh embodiment of the present invention.
Figure 18:
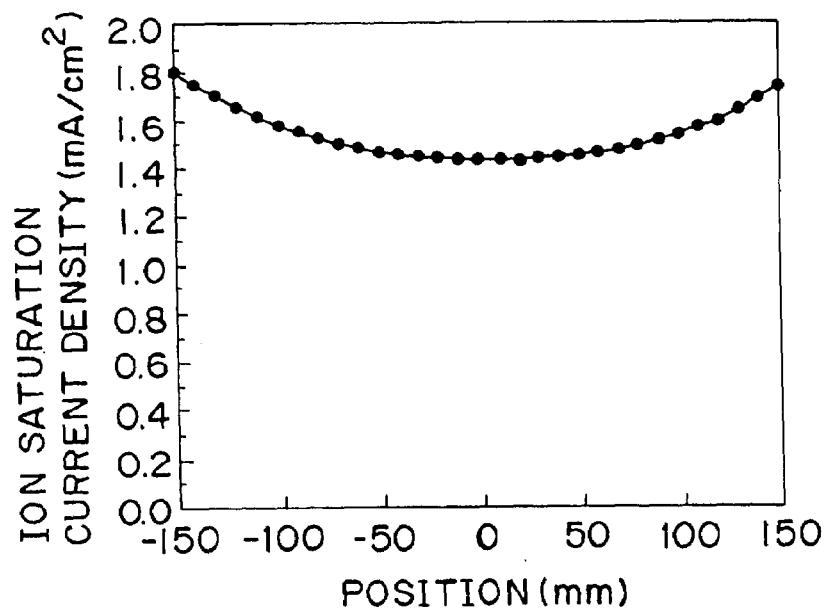
FIG. 18 is a chart showing measuring results of ion saturation current density in a prior art example.

FIG. 9 shows measuring results of ion saturation current density at a position just 20 mm above the substrate 7. Conditions for plasma generation are gas type of $Cl_2$ and gas flow rate of 100 sccm, a pressure of 1 Pa, and a high-frequency power of 2 kW, as one example. It can be understood from FIG. 9 that the tendency for plasma to be richer in peripheral regions as shown in FIG. 18 is suppressed, and that uniform plasma is generated.

Figure 16:
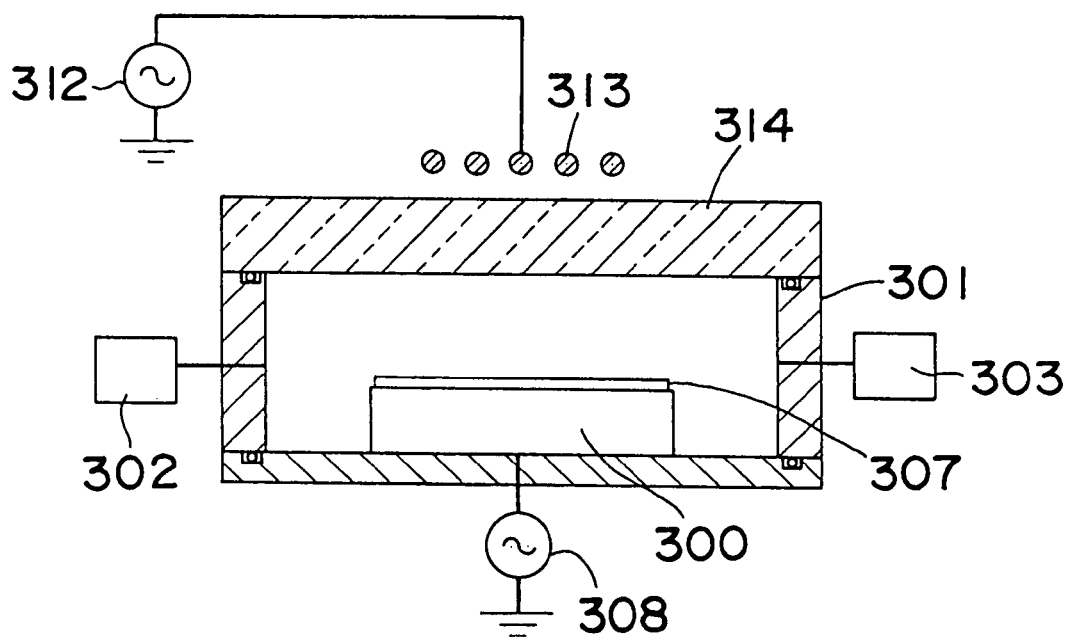
FIG. 16 is a sectional view showing the constitution of a plasma processing apparatus employed in a prior art example.

The reason why the uniformity of plasma is improved like this as compared with the plasma processing apparatus shown in FIG. 16 of the prior art example could be considered as follows. Electromagnetic waves radiated from the spiral antenna 13 are intensified by the plasma trap 9. Also, since plasma of low electron temperature tends to cause hollow cathode discharge, high density plasma (hollow cathode discharge) is more likely to be generated by the plasma trap 9 surrounded by the solid surfaces. Accordingly, in the vacuum chamber 1, plasma density becomes the highest at the plasma trap 9, and through transport of plasma to vicinities of the substrate 7 by diffusion, uniform plasma can be obtained.

Figure 10:
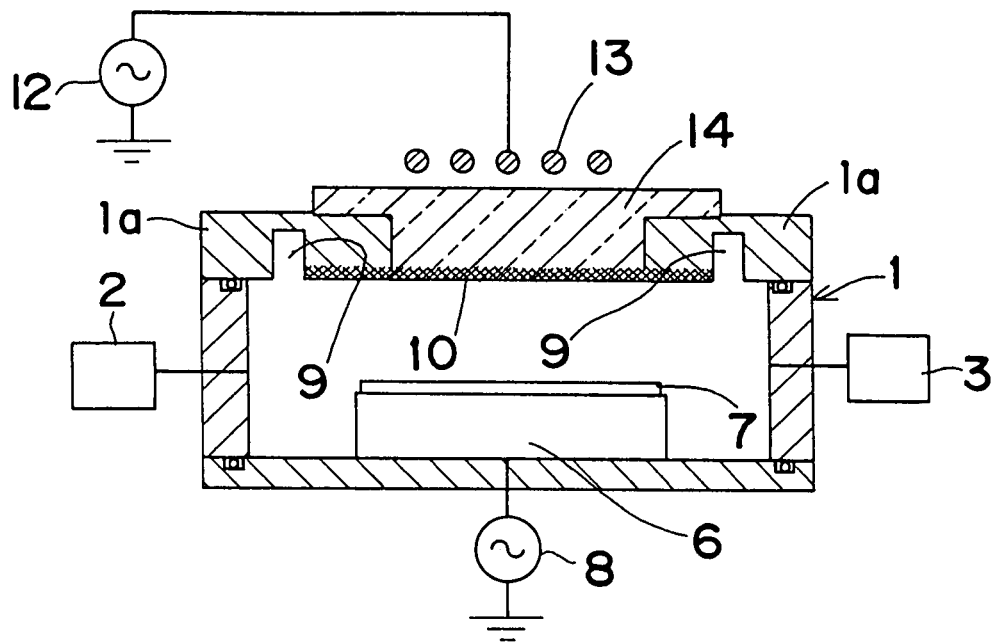
FIG. 10 is a sectional view showing the constitution of a plasma processing apparatus employed in an eighth embodiment of the present invention.
Figure 11:
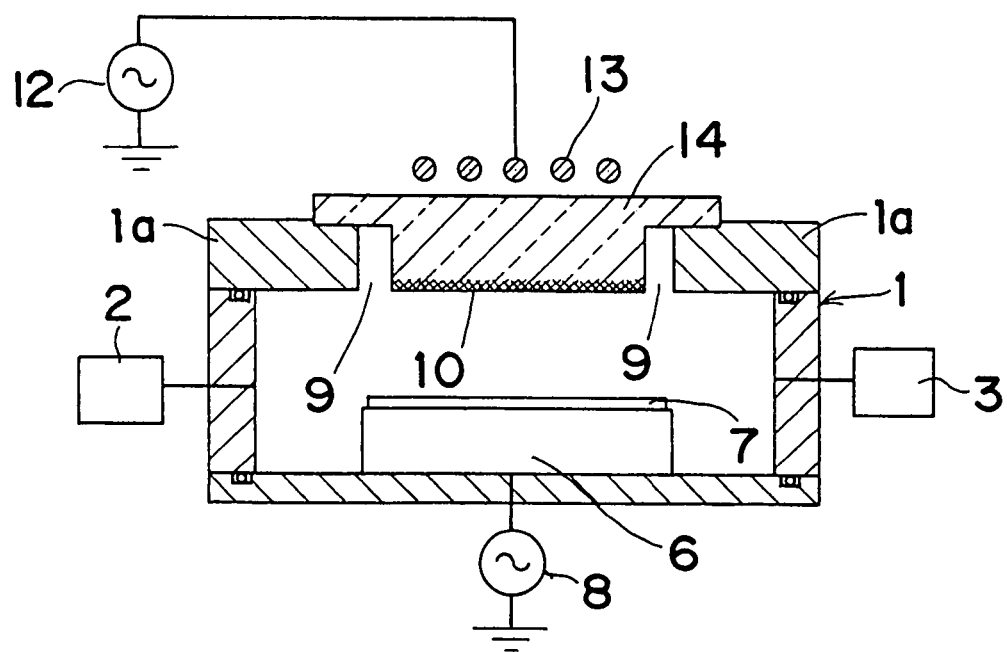
FIG. 11 is a sectional view showing the constitution of a plasma processing apparatus employed in a ninth embodiment of the present invention.

The 7th embodiment of the present invention has been described above for the case where the plasma trap 9 is provided in the dielectric window 14. However, the plasma trap 9 may also be provided outside the dielectric window 14 so as to be defined by three faces, that is, an inner face, an upper face, and an outer face formed in the upper wall 1 a of the vacuum chamber 1 as shown in an eighth embodiment of FIG. 10. Further, the plasma trap 9 may be provided between the vacuum chamber 1 and the dielectric window 14 so as to be defined by three faces, that is, an inner face and an upper face formed by the dielectric window 14, and an outer face formed by the upper wall 1a of the vacuum chamber 1 as shown in a 9th embodiment of FIG. 11. As shown in FIGS. 10 and 11, the plasma trap 9 can be arranged in the upper surface of the vacuum chamber so that the outer diameter of the plasma trap is less than the inner side surface diameter of the vacuum chamber, and a that a metallic surface portion 1a is formed between the outer periphery of the plasma trap and the inner side surface of the vacuum chamber 1.

Figure 12:
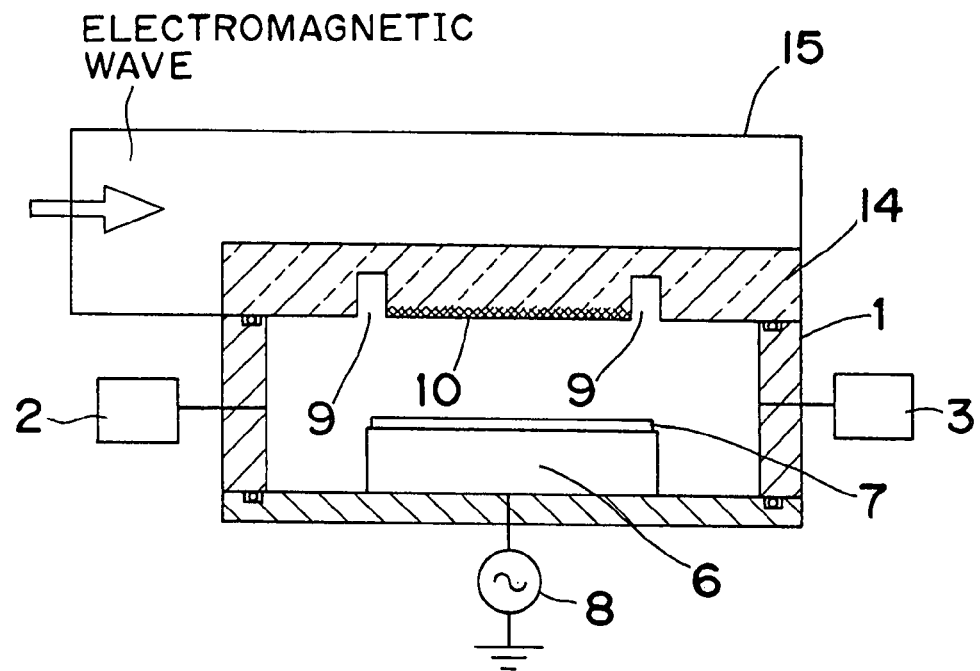
FIG. 12 is a sectional view showing the constitution of a plasma processing apparatus employed in another embodiment of the present invention.
Figure 13:
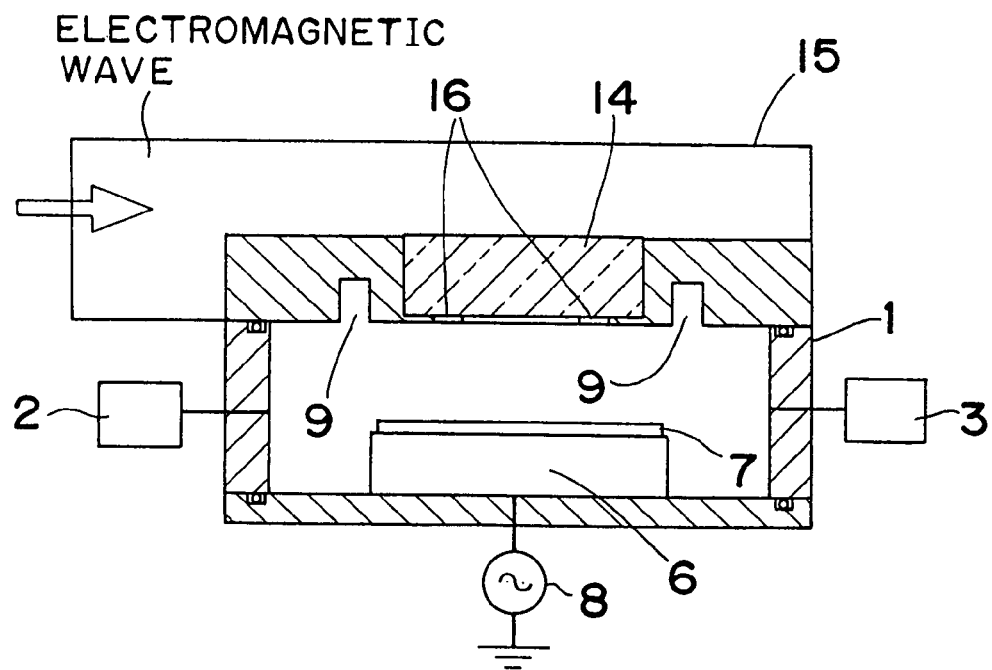
FIG. 13 is a sectional view showing the constitution of a plasma processing apparatus employed in another embodiment of the present invention.

The foregoing embodiments of the present invention as described above are given only by way of example as part of many variations of the configuration of the vacuum chamber 1, the configuration and arrangement of the counter electrode 6 or antenna 13, the configuration and arrangement of the dielectric window 14, and the configuration and arrangement of the plasma trap 9, within the application scope of the present invention. It is needless to say that the present invention may be applied in other various ways besides the examples given above. For example, whereas the foregoing embodiments have been described for the case where the counter electrode 6 is circular shaped, the counter electrode may also be formed in a polygonal, elliptical, or other shape. Also, whereas in each of the foregoing cases, the antenna 13 is spiral shaped, the antenna may be formed in a flat-plate, spoke, or other shape. Otherwise, the present invention may also be applied to a surface-wave plasma processing apparatus having a cavity resonator 15, as shown in FIG. 12, where the cavity resonator 15 is regarded as an antenna. Furthermore, the present invention may be applied to a surface-wave plasma processing apparatus having a cavity resonator 15 and a slot antenna 16, as shown in FIG. 13.

Figure 14:
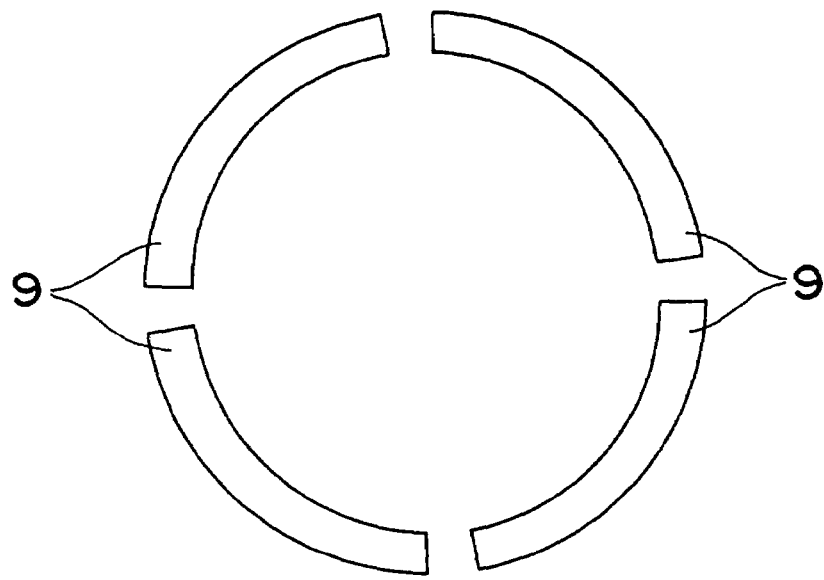
FIG. 14 is a plan view of the constitution of plasma traps employed in another embodiment of the present invention.

The foregoing embodiments of the present invention have been described for the case where the plasma trap 9 is annular shaped. However, the plasma trap 9 may also be formed into a polygonal, elliptical, or other shape in accordance with the configuration of the substrate 7. Otherwise, the plasma trap 9 may be formed into a shape that is not a closed annular shape but a divisional, yet generally annular shape as shown by the plan view of FIG. 14. The above various kinds of arrangement of the plasma trap 9 in FIGS. 8, 10, and 11 etc. can be applied to the apparatus of FIGS. 12 and 13.

Further, whereas the first or seventh embodiment of the present invention has been described for the case where a high-frequency power of 100 MHz is supplied to the counter electrode 6 or antenna 13, the frequency is not limited to this and the present invention is effective for a plasma processing method and apparatus using frequencies of 50 MHz to 3 Ghz.

Also, each of the first to seventh embodiments of the present invention has been described for the case where, out of surfaces forming the inner wall surfaces of the vacuum chamber 1 and opposing the substrate 7, the area of the portion surrounded by the plasma trap 9 is 0.8 times the area of the substrate 7. However, it is desirable that the area of this portion be 0.5-2.5 times the area of the substrate 7. If the area of this portion is less than 0.5 times the area of the substrate 7, it is difficult to obtain uniform plasma in vicinities of the substrate 7 even with a sufficient distance between the substrate 7 and the plasma trap 9. Also, if the area of this portion is over 2.5 times the area of the substrate 7, it is necessary to keep an extremely large distance between the substrate 7 and the plasma trap 9 in order to obtain uniform plasma in vicinities of the substrate 7. This, undesirably, would cause the apparatus to be increased in size, and an excessive burden would be imposed on the pump 3 to hold the interior of the vacuum chamber 1 at a low pressure. For example, when the substrate has a diameter of 300 mm and the plasma trap has a diameter of 200 mm, the area of this portion surrounded by the plasma trap is 0.5 times the area of the substrate. When the substrate has a diameter of 300 mm and the plasma trap has a diameter of 300 mm, the area of this portion surrounded by the plasma trap is 2.5 times the area of the substrate.

Also, each of the first to seventh embodiments of the present invention has been described for the case where the groove width of the plasma trap 9 is 10 mm. However, it is desirable that the groove width of the plasma trap 9 be within a range of 3 mm-50 mm. If the groove width is less than 3 mm, or over 50 mm, there is a possibility that hollow cathode discharge does not occur by the plasma trap 9.

Also, whereas the foregoing embodiments have been described for the case where the groove of the plasma trap 9 is rectangular section-shaped, the groove sectional shape may be U-shaped, V-shaped, or a combination of rectangular shape, U-shape, and V-shape.

Also, each of the first to seventh embodiments of the present invention has been described for the case where the groove depth of the plasma trap 9 is 15 mm. However, it is desirable that the groove depth of the plasma trap 9 be not less than 5 mm. If the groove depth is less than 5 mm, there is a possibility that hollow cathode discharge does not occur.

The plasma processing apparatus of the third embodiment in FIGS. 4 and 10 may be applied in a case where the area surrounded by the plasma trap 9 is larger than the area of the substrate 7. In this case, it is suitable to use per-fluorocarbon gas such as $CF_4$ gas, $C_2F_6$ gas, $C_4F_8$ gas, $C_5F_8$ gas, etc. or hydro-fluorocarbon such as $CHF_3$ gas, $CH_2F_2$, etc.

Figure 27:
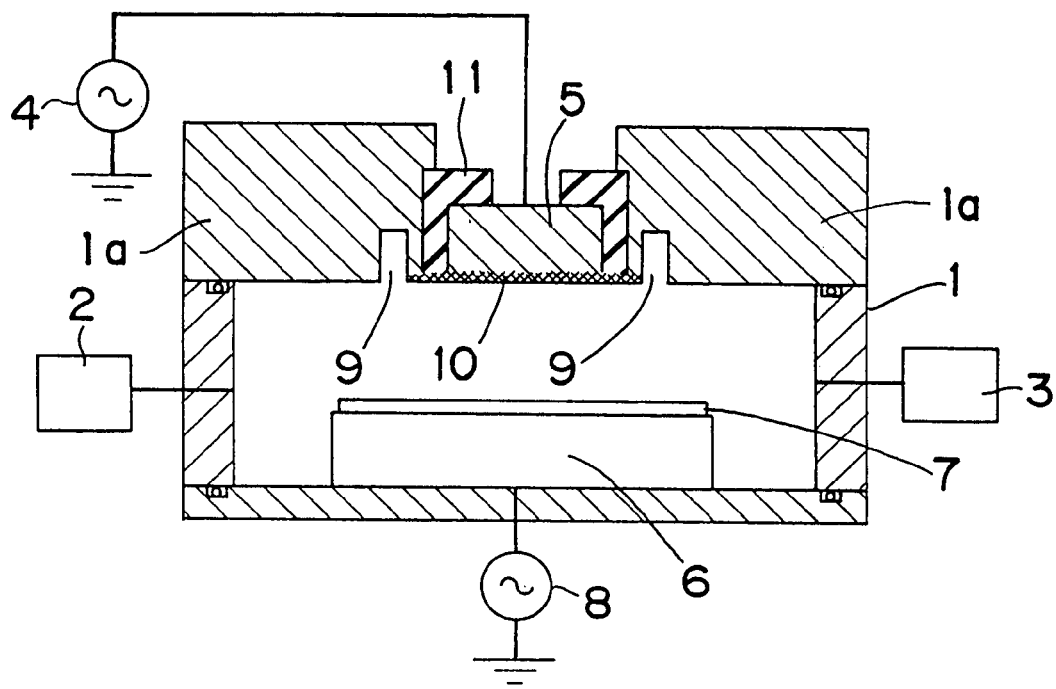
FIG. 27 is a sectional view showing the constitution of a plasma processing apparatus employed in a modification of the third embodiment of the present invention.
Figure 28:
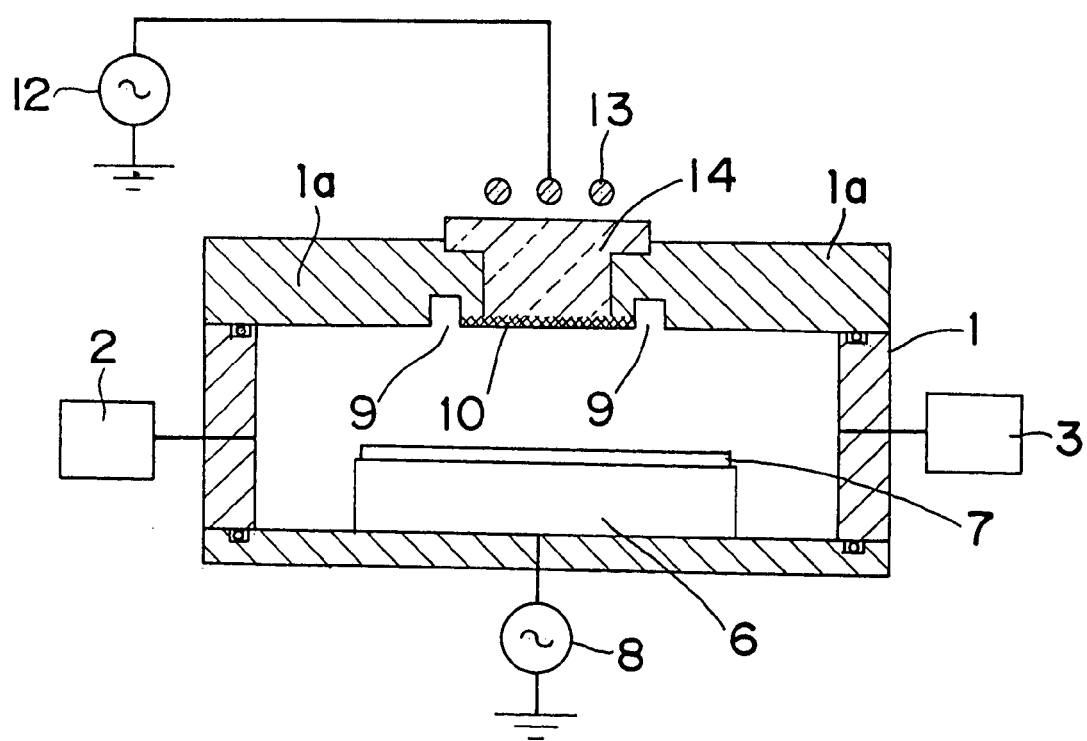
FIG. 28 is a sectional view showing the constitution of a plasma processing apparatus employed in a modification of the eighth embodiment of the present invention.

On the other hand, a plasma processing apparatus of a modification of the third embodiment in FIG. 27 and a plasma processing apparatus of a modification of the eighth embodiment in FIG. 28 may be applied in a case where the area surrounded by the plasma trap 9 is not larger than the area of the substrate 7. In this case, it is suitable to use Boron-based gas such as HBr gas, or chlorine-based gas such as $Cl_2$ gas, $BCl_3$ gas, HCl gas etc.

Please note that although it has been described as one example that the using gas is applied depending on the area surrounded by the plasma trap, the optimum selection of the using gas is not limited to this. The optimum condition can be determined while referring to pressure, power, mixed gas, and the like because the optimum selection of the using gas depends on the conditions such as pressure, power, mixed gas, and the like.

Also, the foregoing embodiments of the present invention have been described for the case where DC magnetic fields are absent in the vacuum chamber 1. However, the present invention is also effective for cases where such large DC magnetic fields as to allow high-frequency power to penetrate into the plasma are absent, for example, a case where small DC magnetic fields on the order of several tens gausses are used for improvement in ignitability. Yet, the present invention is particularly effective for cases where DC magnetic fields are absent in the vacuum chamber 1.

As apparent from the above description, the plasma processing method of the present invention for generating plasma within a vacuum chamber and processing a substrate placed on a substrate electrode within the vacuum chamber comprises generating the plasma by supplying a high-frequency power having a frequency of 50 MHz to 3 GHz to a counter electrode provided opposite to the substrate while the interior of the vacuum chamber is controlled to maintain a specified pressure by introducing gas into the vacuum chamber. Simultaneously, therewith, the interior of the vacuum chamber is evacuated. The substrate is processed by using the generated plasma while distribution of the plasma on the substrate is controlled by an annular, groove-like plasma trap provided opposite to the substrate. Thus, because the substrate is processed while the plasma distribution on the substrate is controlled by the annular, groove-like plasma trap provided opposite to the substrate, uniform plasma can be generated so that the substrate can be uniformly processed.

Also, the plasma processing method of the present invention for generating plasma within a vacuum chamber and processing a substrate placed on a substrate electrode within the vacuum chamber comprises generating the plasma by radiating electromagnetic waves into the vacuum chamber via a dielectric window provided opposite to the substrate by supplying a high-frequency power having a frequency of 50 MHz to 3 GHz to an antenna while the interior of the vacuum chamber is controlled to maintain a specified pressure by introducing gas into the vacuum chamber. Simultaneously, therewith, the interior of the vacuum chamber is evacuated. The substrate is processed by using the generated plasma while plasma distribution of the plasma on the substrate is controlled by an annular, groove-like plasma trap provided opposite to the substrate. In this method, if the substrate is processed while the plasma distribution on the substrate is controlled by the annular, groove-like plasma trap provided opposite to the substrate, uniform plasma can be generated so that the substrate can be uniformly processed.

Also, the plasma processing apparatus of the present invention comprises a vacuum chamber; a gas supply unit for supplying gas into the vacuum chamber; an evacuating device for evacuating the interior of the vacuum chamber; a substrate electrode for placing thereon a substrate within the vacuum chamber; a counter electrode provided opposite to the substrate electrode; high-frequency power supply capable of supplying a high-frequency power having a frequency of 50 MHz to 3 GHz to the counter electrode; and an annular, groove-like plasma trap provided opposite to the substrate. Thus, uniform plasma can be generated so that the substrate can be uniformly processed.

Also, the plasma processing apparatus of the present invention comprises a vacuum chamber; a gas supply unit for supplying gas into the vacuum chamber; an evacuating device for evacuating the interior of the vacuum chamber; a substrate electrode for placing thereon a substrate within the vacuum chamber; a dielectric window provided opposite to the substrate electrode; an antenna for radiating electromagnetic waves into the vacuum chamber via the dielectric window; a high-frequency power supply capable of supplying a high-frequency power having a frequency of 50 MHz to 3 GHz to the antenna; and an annular, groove-like plasma trap provided opposite to the substrate. Thus, uniform plasma can be generated so that the substrate can be uniformly processed.

Now a tenth embodiment of the present invention is described below with reference to FIGS. 19 and 20.

Figure 19:
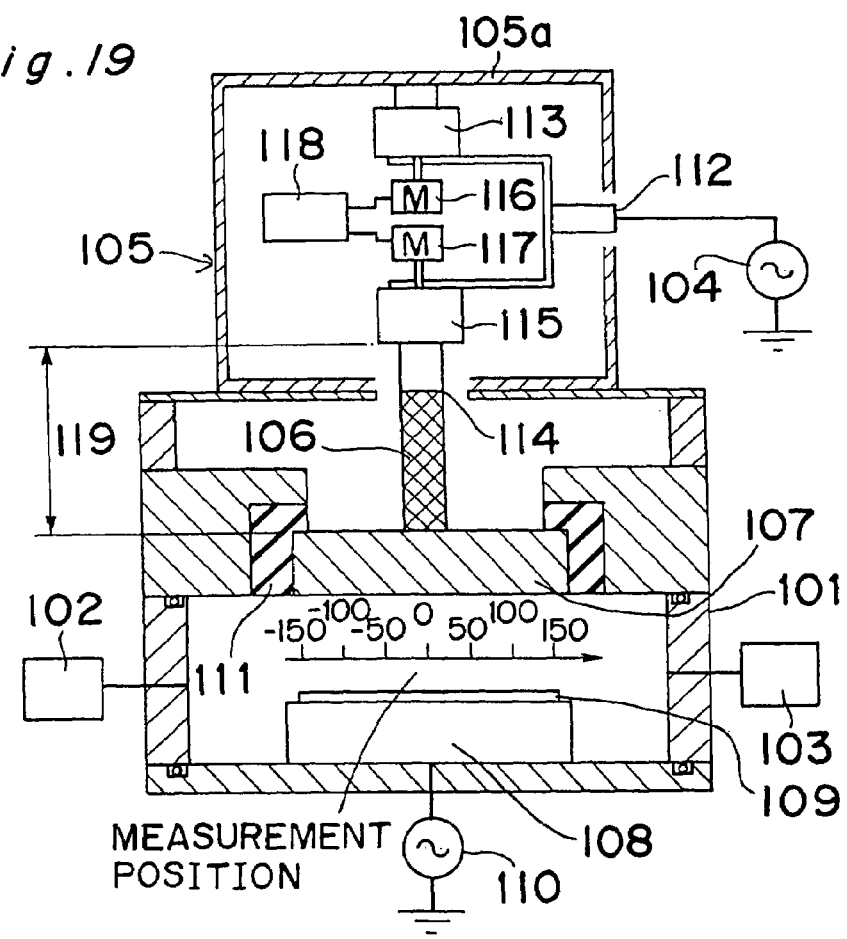
FIG. 19 is a sectional view showing the constitution of a plasma processing apparatus employed in a tenth embodiment of the present invention.

FIG. 19 shows a sectional view of a plasma processing apparatus employed in the tenth embodiment of the present invention. Referring to FIG. 19, while the interior of a vacuum chamber 101 is maintained at a specified pressure by introducing a specified gas from a gas supply unit 102 into the vacuum chamber 101 and simultaneously performing evacuation by a pump 103 as an evacuating device, a high-frequency power of 100 MHz is supplied to a counter electrode 107 by a counter-electrode-use-high-frequency power supply 104 via a matching box 105 and a high-frequency coupling device (mount) 106. Then, plasma is generated in the vacuum chamber 101, where plasma processing such as etching, deposition, and surface reforming can be carried out on a substrate 109 placed on a substrate electrode 108. A substrate-electrode-use-high-frequency power supply 110 for supplying high-frequency power to the substrate electrode 108 is also provided, so that ion energy that reaches the substrate 109 can be controlled. In addition, the counter electrode 107 is insulated from the vacuum chamber 101 by an insulating ring 111.

The matching box 105, which is used to take impedance matching in supplying high-frequency power to the counter electrode 107 as a load, comprises a high-frequency input terminal 112, a first variable capacitor 113, a high-frequency output terminal 114, a second variable capacitor 115, a first motor 116, a second motor 117, and a motor control circuit 118. One end of the first variable capacitor 113 is connected to the high-frequency input terminal 112, the other end being connected to the matching box casing 105a. One end of the second variable capacitor 115 is connected to the high-frequency input terminal 112, the other end being connected to the high-frequency output terminal 114. Also, a straight line forming the center axis of the second variable capacitor 115, a straight line forming the center axis of the high-frequency output terminal 114, a straight line forming the center axis of the high-frequency coupling device (mount) 106, a straight line forming the center axis of the counter electrode 107, and a straight line forming the center axis of the substrate 109 are arranged so as to be generally coincident together. Also, the first variable capacitor 113 and the second variable capacitor 115 are arranged so that the straight line forming the center axis of the second variable capacitor 115 and a straight line forming the center axis of the first variable capacitor 113 are generally coincident with each other. Further, a substantial distance 19 from the other end of the second variable capacitor 115 to the counter electrode 107 is $\frac{1}{15}$ (20 cm) of the wavelength (3 m) of the high-frequency power, as one example.

Figure 20:
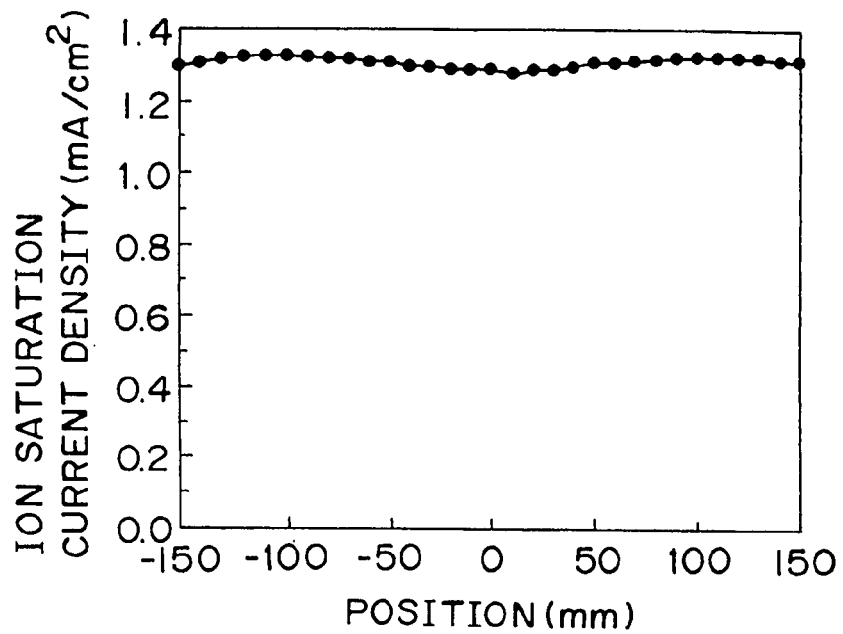
FIG. 20 is a chart showing measuring results of ion saturation current density in the tenth embodiment of the present invention.
Figure 25:
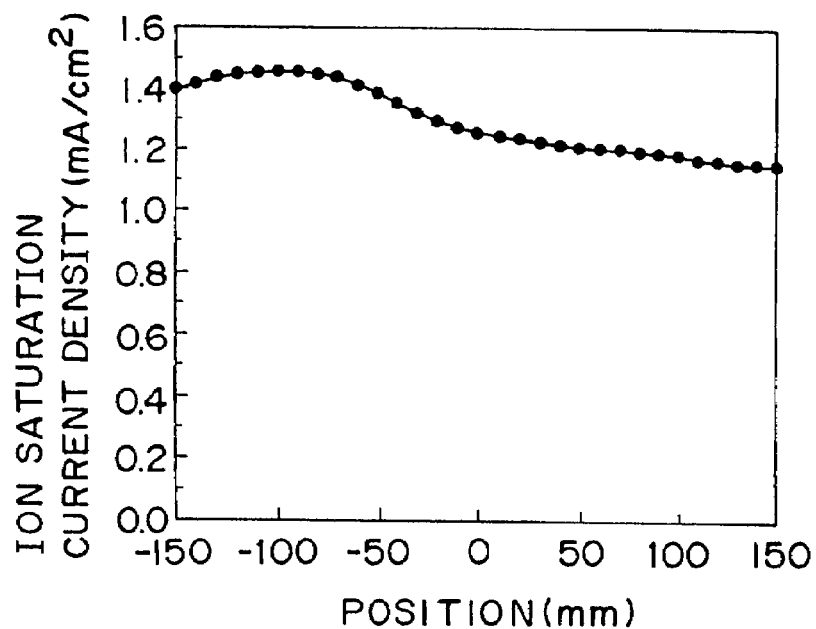
FIG. 25 is a chart showing measuring results of ion saturation current density in the prior art example.
Figure 26:
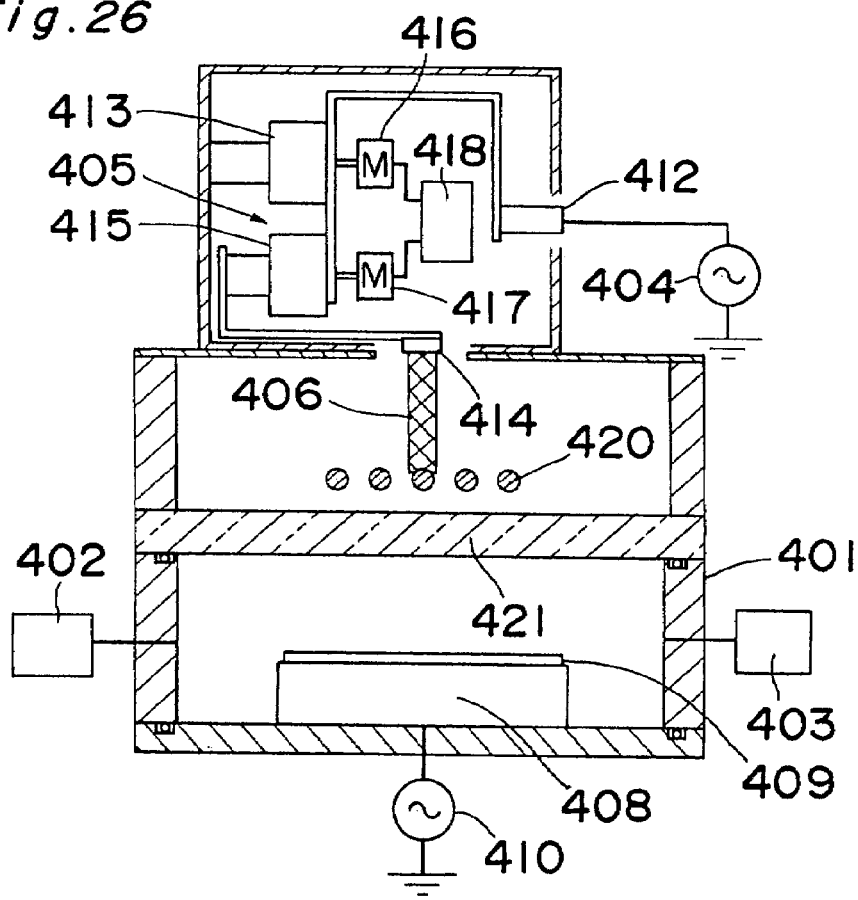
FIG. 26 is a sectional view showing the constitution of a plasma processing apparatus employed in another prior art example.

FIG. 20 shows results of measuring ion saturation current density at apposition just 20 mm above the substrate 109. Conditions for plasma generation are gas type of $Cl_2$ and gas flow rate of 100 sccm, a pressure of 2 Pa, and a high-frequency power of 1 kW, as one example. Also, FIG. 19 shows the measuring position in FIG. 20. It can be understood from FIG. 20 that nonuniformity of plasma as shown in FIG. 25, where plasma density is higher on one side of the measuring position, cannot be seen.

Figure 24:
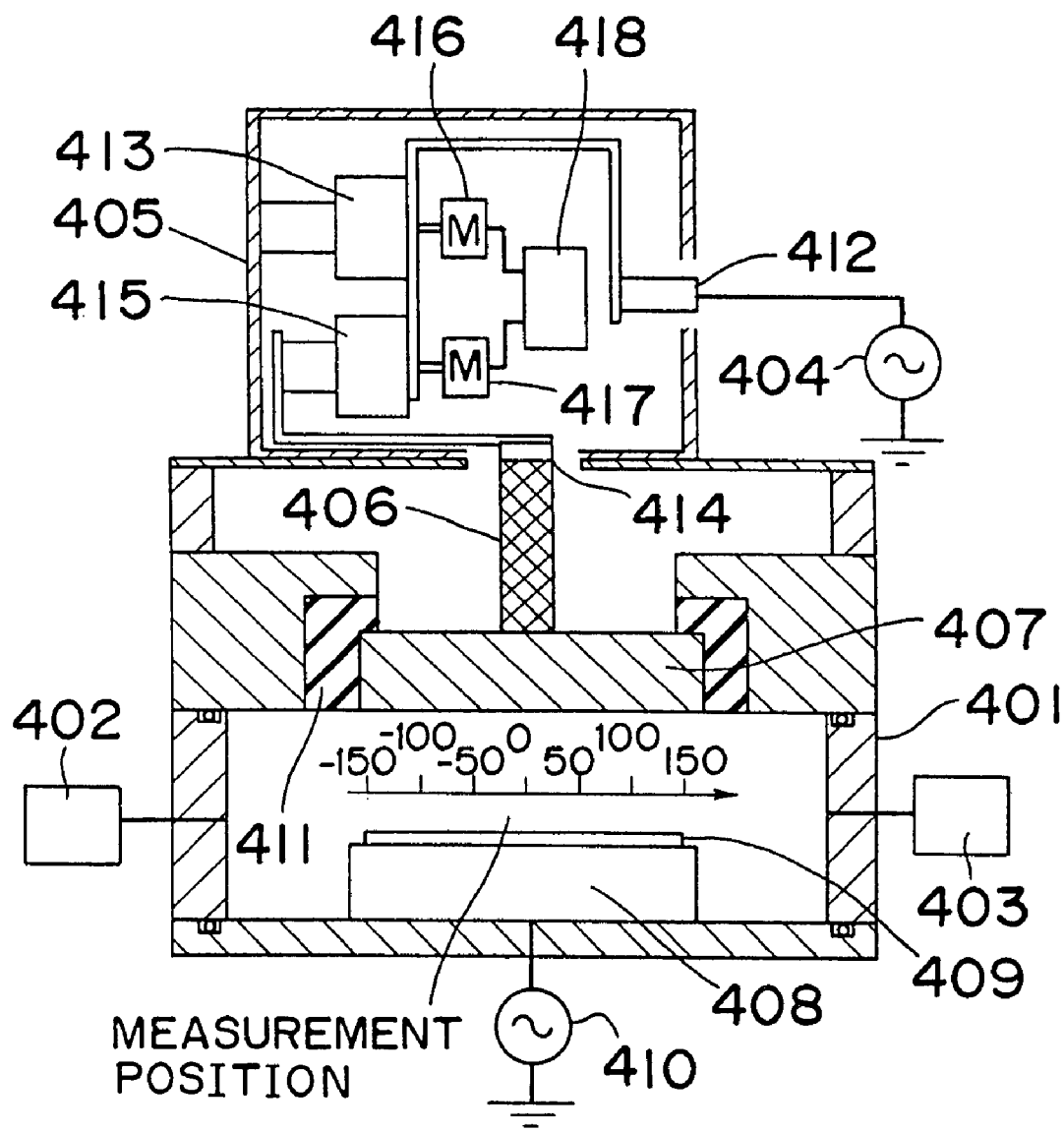
FIG. 24 is a sectional view showing the constitution of a plasma processing apparatus employed in a prior art example.

The reason why the uniformity of plasma is improved like this as compared with the plasma processing apparatus shown in FIG. 24 of the prior art example could be considered as follows. In the case where a high-frequency power of 50 MHz or higher is used, there develops a potential distribution in the counter electrode 107 under the effect of the arrangement of the second variable capacitor 115 within the matching box 105. However, in the tenth embodiment of the present invention, the potential distribution developed on the counter electrode 107 becomes concentric because of the arrangement in which a straight line forming the center axis of the second variable capacitor 115, a straight line forming the center axis of the high-frequency output terminal 114, a straight line forming the center axis of the high-frequency coupling device (mount) 106, a straight line forming the center axis of the counter electrode 107, and a straight line forming the center axis of the substrate 109 are generally coincident together. As a result, the electric fields within the vacuum chamber 101 also become concentric so that the uniformity of plasma can be improved.

Figure 21:
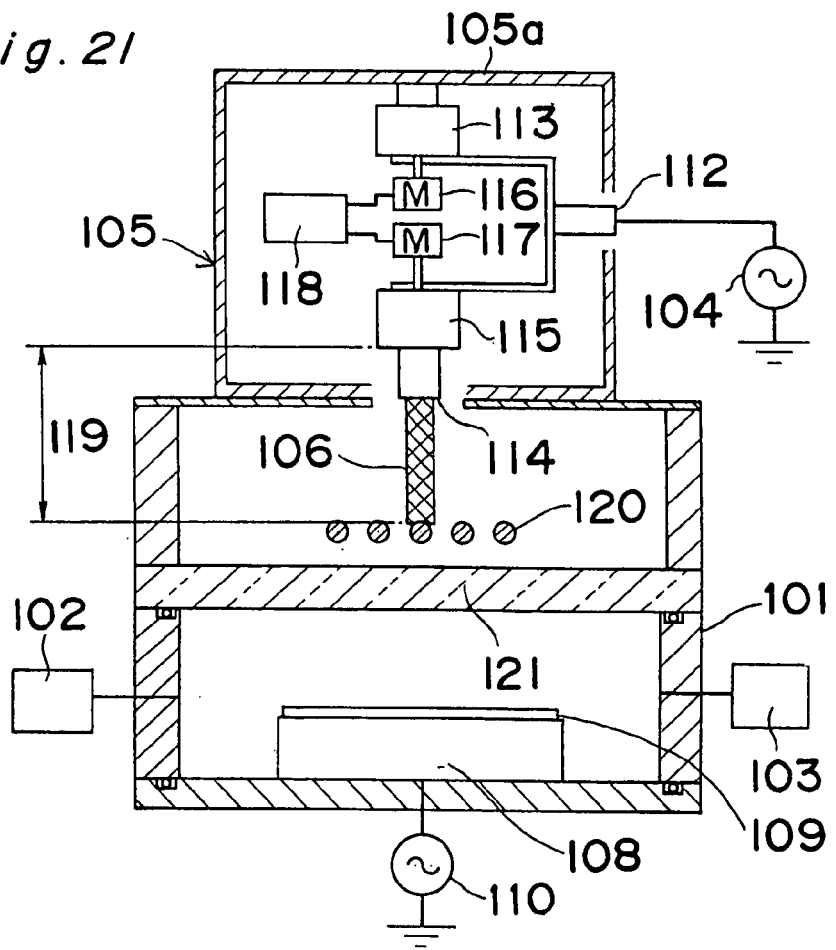
FIG. 21 is a sectional view showing the constitution of a plasma processing apparatus employed in an eleventh embodiment of the present invention.

The foregoing tenth embodiment of the present invention has been described for the case where the counter electrode 107 is used to generate plasma. However, the present invention is also effective for cases where a spiral antenna 120 is used as in an eleventh embodiment of the present invention shown in FIG. 21. In addition, in the eleventh embodiment of the present invention shown in FIG. 21, a dielectric window 121 is used.

Also, the foregoing tenth and eleventh embodiments of the present invention are given only by way of example as part of many variations of the configuration of the vacuum chamber 101, the configuration and arrangement of the counter electrode 107 or antenna 120, the configuration and arrangement of the dielectric 121, and the like within the application scope of the present invention. It is needless to say that the present invention may be applied in other various ways besides the examples given above. For example, whereas the tenth embodiment of the present invention has been described for a case where the counter electrode 107 is circular shaped, the counter electrode may also be formed in a polygonal, elliptical, or other shape. Also, whereas in the foregoing case, the antenna 120 is spiral shaped, the antenna may be formed in a flat-plate, spoke, or other shape.

The foregoing 10th and 11th embodiments of the present invention have been described for the case where the high-frequency power of 100 MHz is supplied to the counter electrode 107 or antenna 120. However, the frequency is not limited to this and the present invention is effective for cases where frequencies of 50 MHz to 300 MHz are used. If the frequency is lower than 50 MHz, the uniformity of plasma can be easily obtained even without applying the present invention. Also, if the frequency is higher than 300 MHz, it is difficult to take impedance matching by using two variable capacitors, giving rise to a need for taking impedance matching by stubs.

Figure 22:
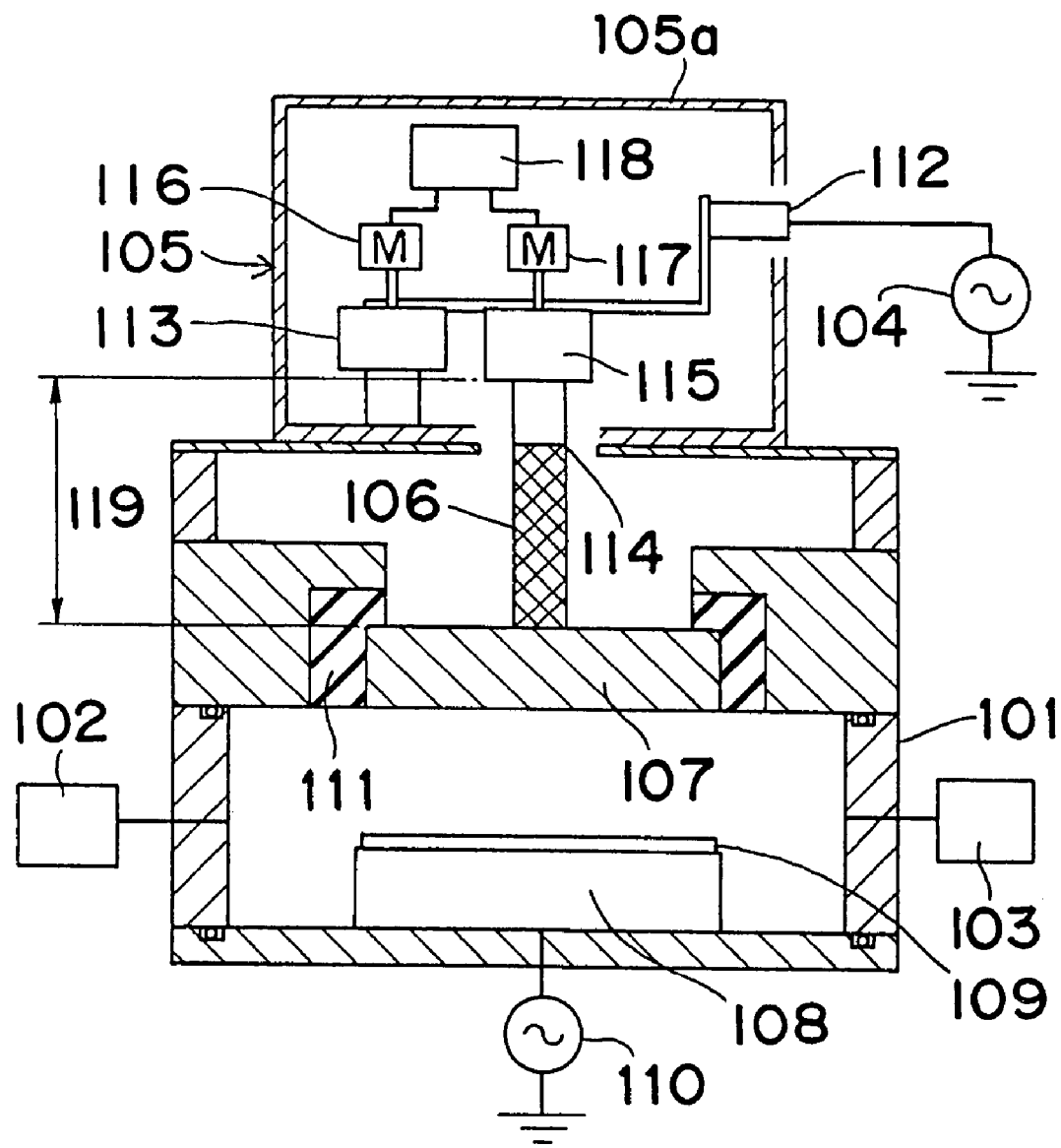
FIG. 22 is a sectional view showing the constitution of a plasma processing apparatus employed in a twelfth embodiment of the present invention.

Also, the 10th and 11th embodiments of the present invention have been described for a case where the first variable capacitor and the second variable capacitor are arranged so that the straight line forming the center axis of the second variable capacitor and the straight line forming the center axis of the first variable capacitor are generally coincident with each other. However, because the potential distribution developed at the counter electrode 107 is affected primarily by the arrangement of the second variable capacitor, the uniformity of plasma is greatly improved, as compared with the prior art, also when the straight line forming the center axis of the second variable capacitor 115 and the straight line forming the center axis of the first variable capacitor 113 are not coincident with each other as in a 12th embodiment of the present invention shown in FIG. 22. Such a constitution as shown in FIG. 22 is effective for cases where the matching box needs to be downsized, the constitution being included in the application scope of the present invention.

Also, the 12th embodiment of the present invention has been described for the case where the matching box has variable capacitors by way of example. However, the present invention produces similar effects also with a matching box having reactive elements such as variable inductors, fixed capacitors, or fixed inductors.

Figure 23:
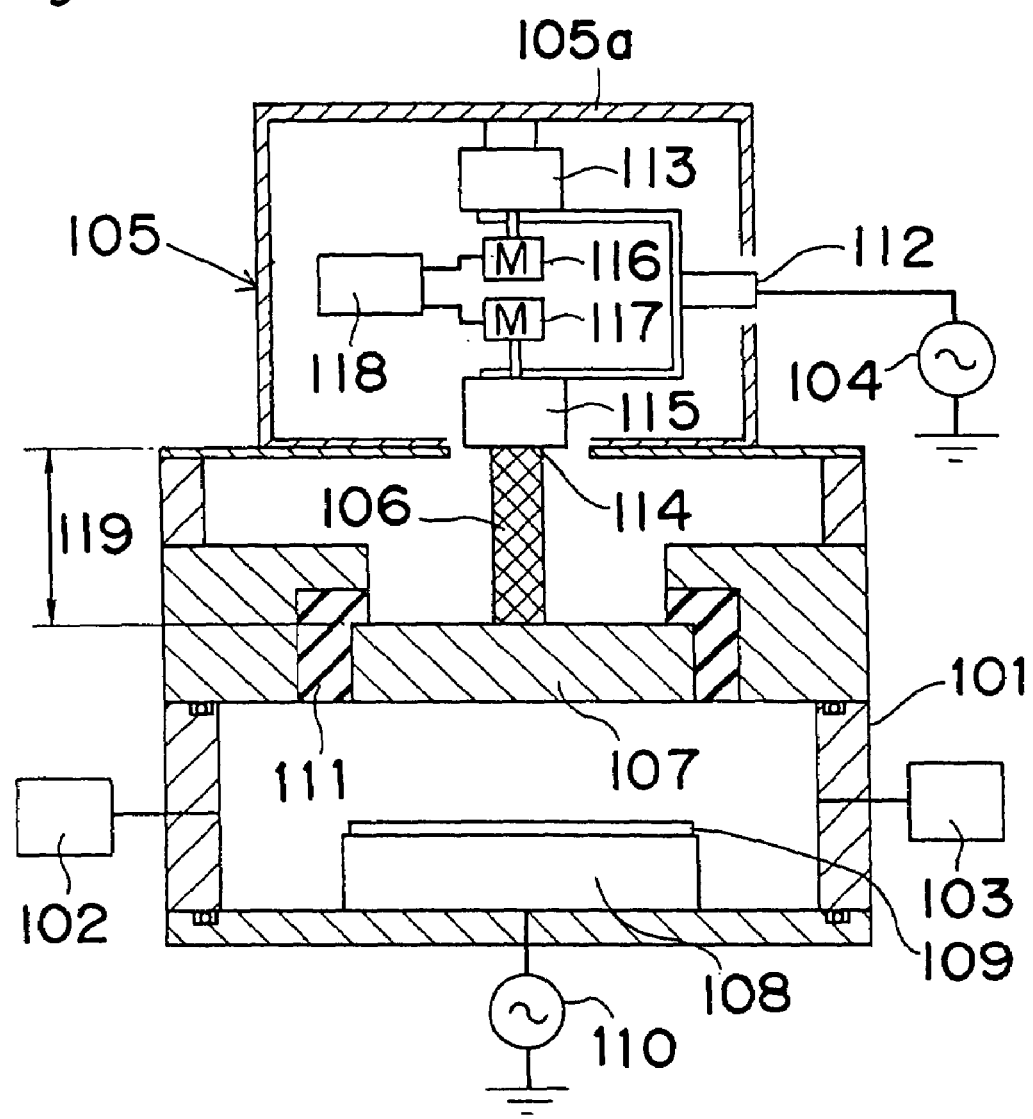
FIG. 23 is a sectional view showing the constitution of a plasma processing apparatus employed in a thirteenth embodiment of the present invention.

Also, whereas the 12th embodiment has been described for the case where the other end of the second variable capacitor 115 and the high-frequency output terminal are provided as separate members. However, the high-frequency output terminal 114 may be provided as the other end of the second variable capacitor 115 itself, as in a 13th embodiment of the present invention shown in FIG. 23.

Also, the 10th embodiment of the present invention has been described on the case where the substantial distance from the other end of the second variable capacitor 115 to the counter electrode 107 is ¹⁄₁₅ of the wavelength of the high-frequency power. It is desirable that the substantial distance from the other end of the second variable capacitor 115 to the counter electrode 107 or antenna 120 be ¹⁄₁₀ or less of the wavelength of the high-frequency power. If the substantial distance from the other end of the second variable capacitor 115 to the counter electrode 107 or antenna is larger than ¹⁄₁₀ of the wavelength of the high-frequency power, the inductance from the other end of the second variable capacitor 115 to the counter electrode 107 or antenna becomes too large, making it difficult to take impedance matching with two variable capacitors.

Figure 29:
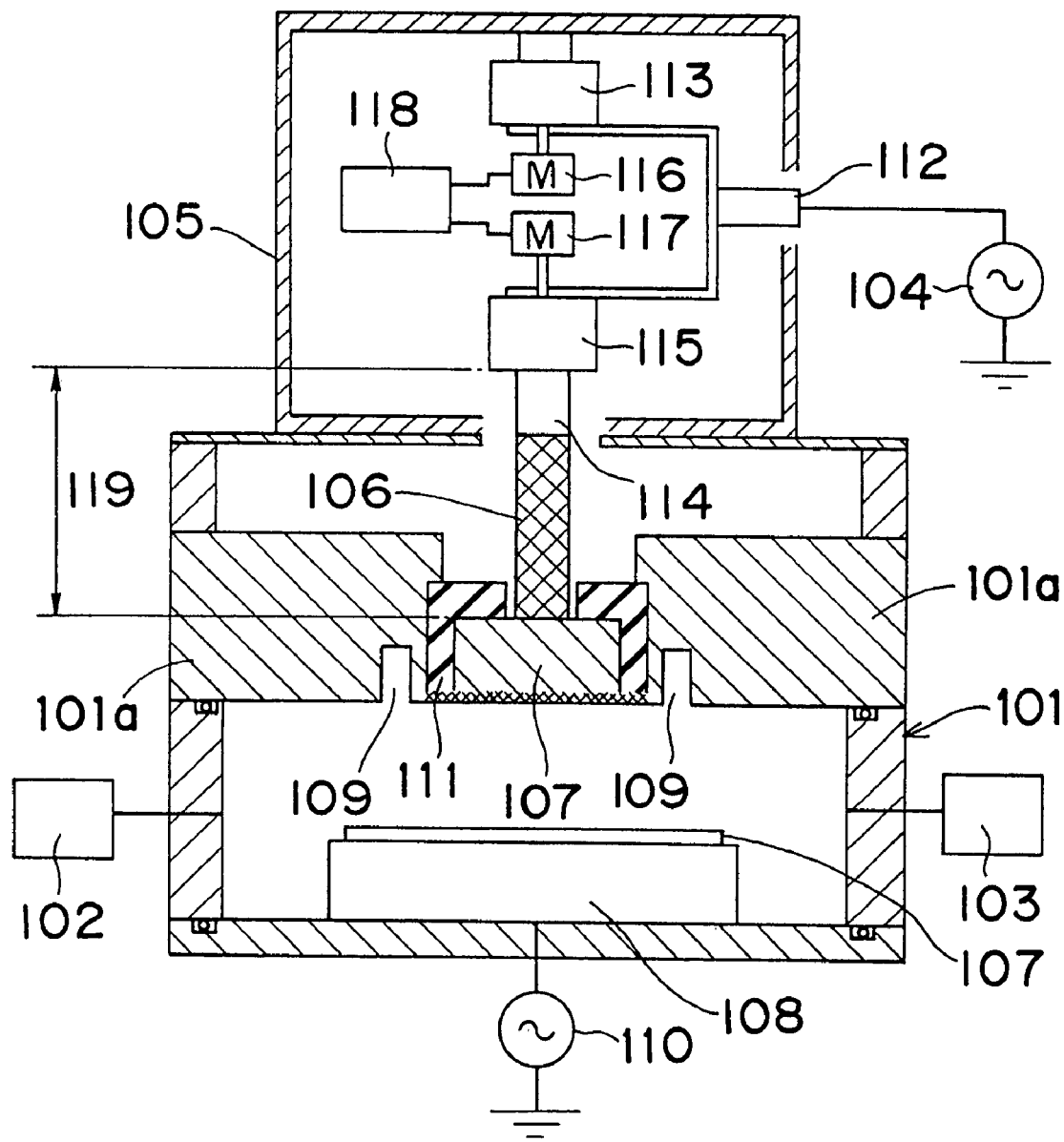
FIG. 29 is a sectional view showing the constitution of a plasma processing apparatus where the plasma processing apparatus in the tenth embodiment of the present invention in FIG. 19 and the plasma processing apparatus in the modification of the third embodiment of the present invention in FIG. 27 are combined with each other.
Figure 30:
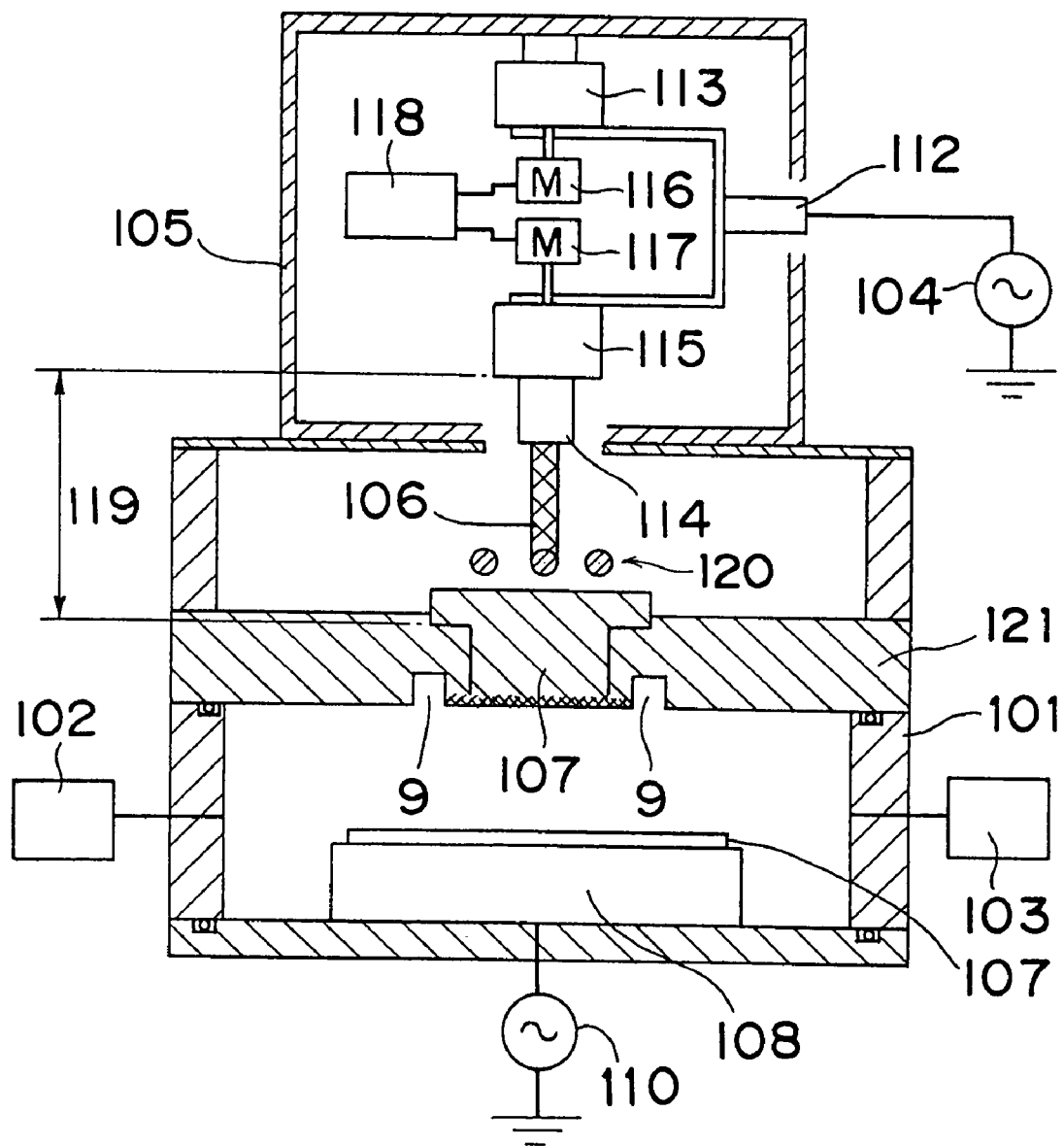
FIG. 30 is a sectional view showing the constitution of a plasma processing apparatus where the plasma processing apparatus in the eleventh embodiment of the present invention in FIG. 21 and the plasma processing apparatus in the modification of the eighth embodiment of the present invention in FIG. 28 are combined with each other.

In the foregoing embodiments, any one of the embodiments can be combined with any other one of the embodiments. For example, FIG. 29 is a sectional view showing the constitution of a plasma processing apparatus where the plasma processing apparatus in the tenth embodiment of the present invention in FIG. 19 and the plasma processing apparatus in the modification of the third embodiment of the present invention in FIG. 27 are combined with each other. FIG. 30 is a sectional view showing the constitution of a plasma processing apparatus where the plasma processing apparatus in the eleventh embodiment of the present invention in FIG. 21 and the plasma processing apparatus in the modification of the eighth embodiment of the present invention in FIG. 28 are combined with each other. Such a combination can obtain both of the effects of the combined embodiments.

As apparent from the above description, the matching box of the present invention is for use in a plasma processing apparatus and for taking impedance matching in supplying high-frequency power to a load. The matching box comprises a high-frequency input terminal; a first reactive element having one end connected to the high-frequency input terminal and the other end connected to a matching box casing; a high-frequency output terminal; and a second reactive element having one end connected to the high-frequency input terminal and the other end connected to the high-frequency output terminal. The second reactive element and the high-frequency output terminal are arranged so that the second reactive element is located on a straight line passing through a center axis of the high-frequency output terminal. Thus, uniform plasma can be generated so that the substrate can be uniformly processed.

Also, the matching box of the present invention is for use in a plasma processing apparatus and for taking impedance matching in supplying high-frequency power to a load. The matching box comprises a high-frequency input terminal; a first variable capacitor having one end connected to the high-frequency input terminal and the other end connected to a matching box casing; a high-frequency output terminal; and a second variable capacitor having one end connected to the high-frequency input terminal and the other end connected to the high-frequency output terminal. The second variable capacitor and the high-frequency output terminal are arranged so that the second variable capacitor is located on a straight line passing through a center axis of the high-frequency output terminal. Thus, uniform plasma can be generated so that the substrate can be uniformly processed.

Also, the plasma processing method of the present invention includes generating plasma within a vacuum chamber and processing a substrate placed on a substrate electrode within the vacuum chamber. The method comprises arranging a straight line passing through a center axis of the high-frequency coupling device, a straight line passing through a center axis of the counter electrode or antenna, and a straight line passing through a center axis of the substrate so as to be generally coincident together. The interior of the vacuum chamber is maintained at a specified pressure by introducing a gas into the vacuum chamber and, simultaneously therewith, exhausting the interior of the vacuum chamber. The plasma is generated by applying a high-frequency power having a frequency of 50 MHz to 300 MHz to a counter electrode or antenna provided opposite to the substrate via the matching box, and a high-frequency coupling device is provided to connect a high-frequency output terminal of the matching box and the counter electrode or antenna to each other. The substrate is processed by using the generated plasma. Thus, uniform plasma can be generated so that the substrate can be uniformly processed.

Also, the plasma processing method of the present invention is for generating plasma within a vacuum chamber and processing a substrate placed on a substrate electrode within the vacuum chamber. The method comprises arranging a straight line passing through a center axis of the high-frequency coupling device, a straight line passing through a center axis of the counter electrode or antenna, and a straight line passing through a center axis of the substrate so as to be generally coincident together. The interior of the vacuum chamber is maintained at a specified pressure by introducing a gas into the vacuum chamber and, simultaneously therewith, exhausting the interior of the vacuum chamber. The plasma is generated by applying a high-frequency power having a frequency of 50 MHz to 300 MHz to a counter electrode or antenna provided opposite to the substrate via the matching box, and a high-frequency coupling device is provided to connect a high-frequency output terminal of the matching box and the counter electrode or antenna to each other. The substrate is processed by using the generated plasma. Thus, uniform plasma can be generated so that the substrate can be uniformly processed.

Also, the plasma processing apparatus comprises a vacuum chamber; a gas supply unit for supplying gas into the vacuum chamber; an evacuating device for evacuating the interior of the vacuum chamber; a substrate electrode for placing thereon a substrate within the vacuum chamber; a counter electrode or an antenna provided opposite to the substrate electrode; a high-frequency power supply capable of supplying a high-frequency power having a frequency of 50 MHz to 300 MHz to the counter electrode or antenna; the matching box as defined in the 28th aspect; and a high-frequency coupling device for connecting the high-frequency output terminal of the matching box and the counter electrode or antenna to each other. A straight line passing through a center axis of the high-frequency coupling device, a straight line passing through a center axis of the counter electrode or antenna, and a straight line passing through a center axis of the substrate are arranged so as to be generally coincident together. Thus, uniform plasma can be generated so that the substrate can be uniformly processed.

Also, the plasma processing apparatus comprises a vacuum chamber; a gas supply unit for supplying gas into the vacuum chamber; an evacuating device for evacuating the interior of the vacuum chamber; a substrate electrode for placing thereon a substrate within the vacuum chamber; a counter electrode or an antenna provided opposite to the substrate electrode; high-frequency power supply capable of supplying a high-frequency power having a frequency of 50 MHz to 300 MHz to the counter electrode or antenna; the matching box as defined in the 33rd aspect; and a high-frequency coupling device for connecting the high-frequency output terminal of the matching box and the counter electrode or antenna to each other. A straight line passing through a center axis of the high-frequency coupling device, a straight line passing through a center axis of the counter electrode or antenna, and a straight line passing through a center axis of the substrate are arranged so as to be generally coincident together. Thus, uniform plasma can be generated so that the substrate can be uniformly processed.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

We claim:

1. A plasma processing method for generating plasma within a vacuum chamber and processing a substrate placed on a substrate electrode within the vacuum chamber, the method comprising:

generating the plasma by supplying a high-frequency power having a frequency of 50 MHz to 3 GHz to a counter electrode provided opposite to the substrate while the interior of the vacuum chamber is controlled to a specified pressure by introducing gas into the vacuum chamber and, simultaneously therewith, evacuating the interior of the vacuum chamber; and processing the substrate using the generated plasma while controlling plasma distribution on the substrate using a single annular groove formed between the vacuum chamber and an insulating ring for insulating the vacuum chamber and the counter electrode from each other, wherein said insulating ring annularly surrounds the counter electrode, wherein the annular groove being located so that an outer-side face of the annular groove is located inside of and is non-coplanar with an inner surface of a sidewall of the vacuum chamber, and so that the annular groove has a groove width in a range of 3 mm to 50 mm.

2. A plasma processing apparatus comprising:

a vacuum chamber;

a gas supply unit for supplying gas into said vacuum chamber;

an evacuating device for evacuating an interior of said vacuum chamber;

a substrate electrode for placing thereon a substrate within said vacuum chamber;

a counter electrode provided opposite to said substrate electrode;

a high-frequency power supply operable to supply a high-frequency power having a frequency of 50 MHz to 3 GHz to said counter electrode; and a single annular groove formed between said vacuum chamber and an insulating ring for insulating said vacuum chamber and said counter electrode from each other, wherein said insulating ring annularly surrounds the counter electrode, wherein said annular groove being located so that an outer-side face of said annular groove is located inside of and is non-coplanar with an inner surface of a sidewall of said vacuum chamber, said annular groove having a groove width in a range of 3 mm to 50 mm.

3. The plasma processing method of claim 1, wherein the single annular groove defines a plasma trap located opposite the substrate.

4. The plasma processing method of claim 1, further comprising supplying a gas into the vacuum chamber at a location outside of the annular groove such that no gas is introduced directly into the annular groove from outside the vacuum chamber.

5. The plasma processing apparatus of claim 2, wherein said single annular groove defines a plasma trap located opposite the substrate.

6. The plasma processing apparatus of claim 2, further comprising a gas inlet for introducing a gas into the vacuum chamber, said gas inlet being located such that no gas is introduced directly into the annular groove from outside the vacuum chamber.

7. The plasma processing apparatus of claim 2, wherein said vacuum chamber includes an upper wall, said annular groove being located between said upper wall of said vacuum chamber and said insulating ring.

8. The plasma processing method of claim 1, wherein an entirety of the annular groove is spaced apart from the inner surface of the sidewall of the vacuum chamber.

9. The plasma processing method of claim 1, wherein the annular groove is located between a surface of an upper wall of the vacuum chamber and the insulating ring.

10. The plasma processing method of claim 9, wherein the annular groove is located so that a shoulder portion of the upper wall is located between the outer-side face of the annular groove and the inner surface of the sidewall of the vacuum.

11. The plasma processing method of claim 1, wherein the outer-side face of the annular groove is a surface different from the inner surface of the sidewall of the vacuum chamber.

12. The plasma processing apparatus of claim 2, wherein an entirety of said annular groove is spaced apart from said inner surface of said sidewall of said vacuum chamber.

13. The plasma processing apparatus of claim 2, wherein said annular groove is located between a surface of an upper wall of said vacuum chamber and said insulating ring.

14. The plasma processing apparatus of claim 13, wherein said annular groove is located so that a shoulder portion of said upper wall is located between said outer-side face of said annular groove and said inner surface of said sidewall of said vacuum.

15. The plasma processing apparatus of claim 2, wherein said outer-side face of said annular groove is a surface different from said inner surface of said sidewall of said vacuum chamber.

* * * * *

UNITED STATES PATENT AND TRADEMARK OFFICE
CERTIFICATE OF CORRECTION

PATENT NO.        : 7,513,214 B2
APPLICATION NO.   : 10/920180
DATED             : April 7, 2009
INVENTOR(S)       : Tomohiro Okumura et al.

It is certified that error appears in the above-identified patent and that said Letters Patent is hereby corrected as shown below:

<u>On the Cover Page</u>
In Section (56) References Cited, under the "U.S. PATENT DOCUMENTS" heading, please insert the following reference:

--5,543,184    08/1996    Barnes et al.--

Signed and Sealed this

Seventeenth Day of November, 2009

David J. Kappos
*Director of the United States Patent and Trademark Office*